US012667021B2

(12) United States Patent
Nishizawa

(10) Patent No.: US 12,667,021 B2
(45) Date of Patent: Jun. 23, 2026

(54) METHOD FOR MANUFACTURING SEMICONDUCTOR MODULE

(71) Applicant: FUJI ELECTRIC CO., LTD.,
Kawasaki (JP)

(72) Inventor: Tatsuo Nishizawa, Matsumoto-city (JP)

(73) Assignee: FUJI ELECTRIC CO., LTD.,
Kawasaki (JP)

( * ) Notice: Subject to any disclaimer, the term of this patent is extended or adjusted under 35 U.S.C. 154(b) by 253 days.

(21) Appl. No.: 18/344,314

(22) Filed: Jun. 29, 2023

(65) Prior Publication Data

US 2024/0055422 A1     Feb. 15, 2024

(30) Foreign Application Priority Data

Aug. 9, 2022    (JP) .................................. 2022-127030

(51) Int. Cl.
*H01L 25/00*         (2006.01)
*H01L 23/00*         (2006.01)
(Continued)

(52) U.S. Cl.
CPC ...... *H10W 90/00* (2026.01); *H10W 72/07331* (2026.01); *H10W 72/07332* (2026.01);
(Continued)

(58) Field of Classification Search
CPC ......... H01L 25/50; H01L 24/83; H01L 24/32; H01L 24/48; H01L 24/73; H01L 2224/32245; H01L 2224/48175; H01L 2224/73265; H01L 2224/83201; H01L 2224/8384
See application file for complete search history.

(56) References Cited

U.S. PATENT DOCUMENTS 8,915,418 B2    12/2014  Shiratori et al.
11,380,647 B2    7/2022  Schivalocchi
(Continued)

FOREIGN PATENT DOCUMENTS

JP      2008-205068 A      9/2008
JP      2013-125769 A      6/2013
(Continued)

OTHER PUBLICATIONS

Machine English Translation of JP 2014239170, Kumada et al., Method of Manufacturing Power Semiconductor Device and Power Semiconductor Device, published Dec. 18, 2014.*
(Continued)

*Primary Examiner* — Peniel M Gumedzoe

(57) ABSTRACT

A method for manufacturing a semiconductor module includes arranging an insulating wiring board on a lower die, arranging sintered materials at a plurality of points on the insulating wiring board, arranging each semiconductor chip on the sintered materials, arranging each buffer material individually on the semiconductor chips, arranging, above the lower die, an upper die including protrusions at points corresponding to arrangement positions of the semiconductor chips so that the protrusions correspond to the semiconductor chips, and sintering by pressurizing and heating the sintered materials by the protrusions through the buffer materials and the semiconductor chips.

10 Claims, 11 Drawing Sheets

(51) Int. Cl.
    *H10W 90/00*       (2026.01)
    *H10W 72/00*       (2026.01)

(52) U.S. Cl.
    CPC ........ *H10W 72/884* (2026.01); *H10W 90/736*
              (2026.01); *H10W 90/755* (2026.01)

(56)             References Cited

U.S. PATENT DOCUMENTS

| | | | |
|---|---|---|---|
| 2013/0040424 A1* | 2/2013 | Bayerer ............ | H01L 21/68778 |
| | | | 156/583.1 |
| 2014/0263581 A1 | 9/2014 | Shiratori et al. | |
| 2019/0326250 A1 | 10/2019 | Schivalocchi | |
| 2021/0170708 A1 | 6/2021 | Schivalocchi | |

FOREIGN PATENT DOCUMENTS

| | | | |
|---|---|---|---|
| JP | 2014-179419 A | 9/2014 | |
| JP | 2021-027288 A | 2/2021 | |
| JP | 2021-150548 A | 9/2021 | |
| JP | 2021-197447 A | 12/2021 | |
| WO | 2018/122795 A1 | 7/2018 | |
| WO | 2020/008287 A1 | 1/2020 | |

OTHER PUBLICATIONS

Japanese Office Action dated May 12, 2026 for Japanese Patent Application No. 2022-127030.

* cited by examiner

METHOD FOR MANUFACTURING SEMICONDUCTOR MODULE

TECHNICAL FIELD

The present invention relates to a method for manufacturing a semiconductor module including semiconductor chips.

BACKGROUND ART

Patent Document 1 discloses "a semiconductor manufacturing device including a lower jig on which an insulating circuit board is placed when bonding a plurality of semiconductor chips onto the insulating circuit board by a sintered material, an upper jig arranged to face the lower jig and provided with an opening portion, a first elastic member held in the opening portion of the upper jig, and a buffer layer arranged between the lower jig and the first elastic member and being thinner than the first elastic member, in which the sintered material is sintered by heating while pressuring upper surfaces of the plurality of semiconductor chips by the first elastic member to bond the insulating circuit board and the plurality of semiconductor chips together." Further, Patent Document 1 discloses the semiconductor manufacturing device in which "the first elastic member is divided into a plurality of first elastic members, and each of the first elastic members pressurizes each of the plurality of semiconductor chips."

Patent Document 2 discloses "a semiconductor device including semiconductor chips, an insulating circuit board arranged to face lower surfaces of the semiconductor chips, and a first sintered metal layer arranged on an upper surface of the insulating circuit board and having a bonding portion in contact with the semiconductor chips and an outer edge portion surrounding the bonding portion, in which in the first sintered metal layer, the bonding portion and the outer edge portion are uniform in a porosity indicating a volume density of pores contained in the first sintered metal layer."

Patent Document 3 discloses a semiconductor device in which "a plurality of sintered materials is arranged on an insulating circuit board, a semiconductor chip is arranged on each sintered material, a buffer layer is arranged to cover each semiconductor chip, and pressurizing portions are arranged on the buffer layer to pressurize by pushing each semiconductor chip." Further, Patent Document 3 discloses that since the thickness of a frame material is thinner than a total thickness of the sintered materials and the semiconductor chips, the sintered materials and the semiconductor chips can be pressurized while preventing the upper surfaces of the semiconductor chips from contacting the frame material."

Patent Documents 4 and 5 disclose "a sintering press that, to sinter electronic components on a substrate, pressurizes each electronic component by a plurality of cylinders through a single sealing membrane."

CITATION LIST

Patent Document(s)

Patent Document 1: JP 2021-150548 A
Patent Document 2: JP 2021-027288 A

Patent Document 3: JP 2021-197447 A
Patent Document 4: WO 2018/122795
Patent Document 5: WO 2020/008287

SUMMARY OF INVENTION

Technical Problem

Patent Documents 1 to 5 disclose a technology of applying a sintered material as a material for bonding electronic components such as semiconductor chips to a predetermined conductive layer. Sintered materials are higher in melting point than solder, and do not have reduced shear strength at power semiconductor operating temperatures of from 150 to 175° C. Therefore, sintered materials can also be used to bond semiconductor chips that are operated at even higher temperatures, such as silicon carbide (SiC) chips and gallium nitride (GaN) chips.

To sinter a sintered material, it is necessary to apply uniform pressure and heat to a portion to be sintered. Therefore, when mounting semiconductor chips at a plurality of points on a single insulating wiring board, it is difficult to apply uniform pressure and heat to a plurality of sintered materials for bonding the semiconductor chips to the insulating wiring board due to variation in thicknesses of the semiconductor chips and the insulating wiring board.

It is an object of the present invention to provide a method for manufacturing a semiconductor module that allows for uniform pressurization and heating onto a plurality of sintered materials for bonding a plurality of semiconductor chips to an insulating wiring board.

Solution to Problem

To achieve the above object, a method for manufacturing a semiconductor module according to one aspect of the present invention includes arranging an insulating wiring board on a lower die, arranging sintered materials at a plurality of points on the insulating wiring board, arranging each semiconductor chip on the plurality of sintered materials, arranging each buffer material individually on the plurality of semiconductor chips, arranging, above the lower die, an upper die including protrusions at points corresponding to arrangement positions of the plurality of semiconductor chips so that the plurality of protrusions correspond to the plurality of semiconductor chips, and sintering by pressurizing and heating the plurality of sintered materials by means of the protrusions through the plurality of buffer materials and the plurality of semiconductor chips.

According to the one aspect of the present invention, uniform pressurization and heating can be applied on the plurality of sintered materials for bonding the plurality of semiconductor chips to the insulating wiring board.

DESCRIPTION OF EMBODIMENTS

Each embodiment of the present invention exemplifies devices and methods for embodying the technological idea of the present invention, and the technological idea of the present invention does not specify the materials, shapes, structures, arrangements, and the like of components to those described below. The technological idea of the present invention can be modified in various ways within the technological scope defined by the appended claims.

Embodiment 1

A method for manufacturing a semiconductor module according to Embodiment 1 of the present invention is described using FIGS. 1 to 12.

(Configuration of Semiconductor Module)

Figure 1:
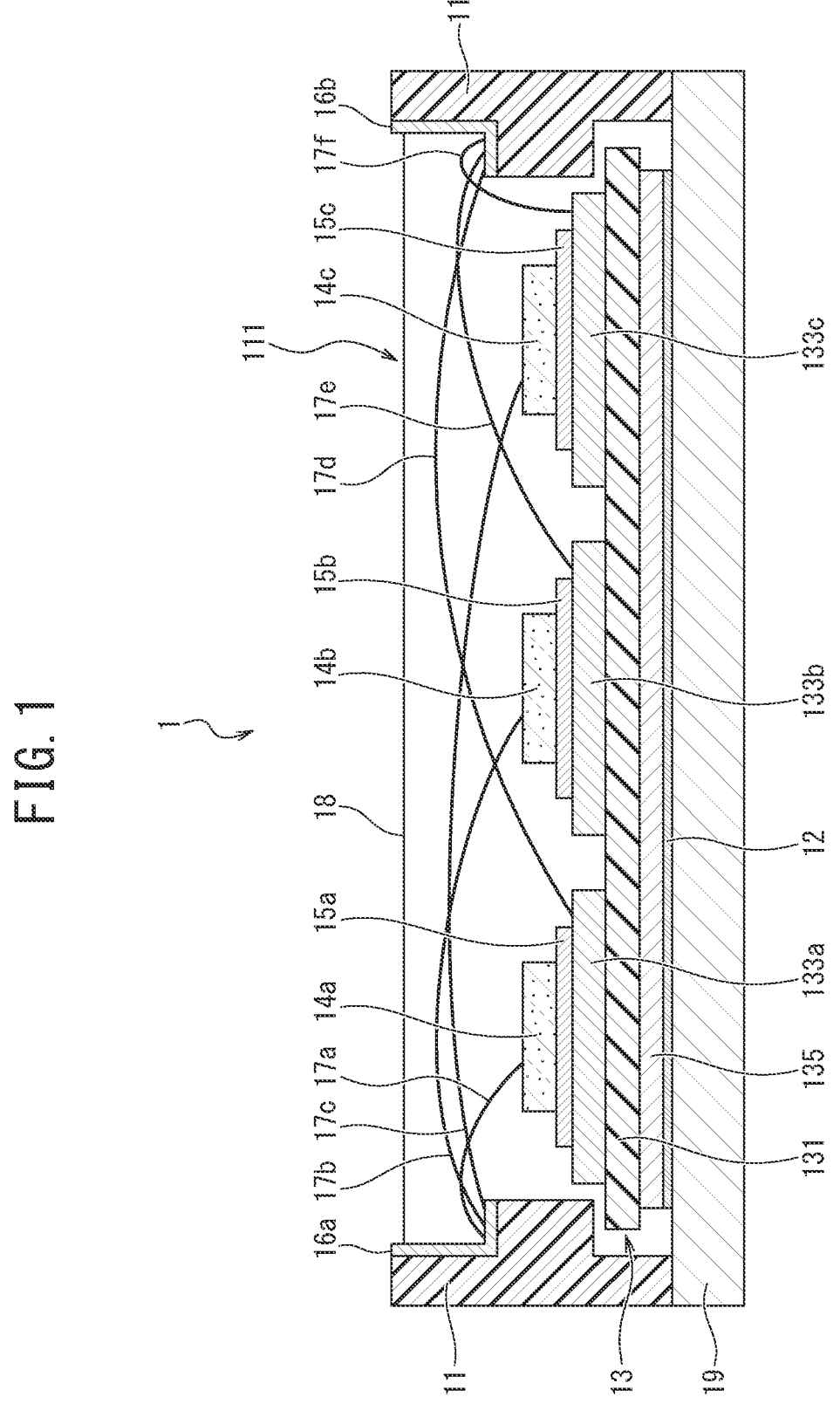
FIG. 1 is a cross-sectional schematic diagram illustrating an example of a schematic configuration of a semiconductor module manufactured by a method for manufacturing a semiconductor module according to Embodiment 1 of the present invention.

A schematic configuration of a semiconductor module 1 manufactured by the method for manufacturing a semiconductor module according to the present embodiment is described using FIG. 1. FIG. 1 is a diagram schematically illustrating a cross-section of the semiconductor module 1 taken at a predetermined point where an insulating wiring board 13 included in the semiconductor module 1 is arranged. For ease of understanding, FIG. 1 illustrates a sealing resin 18 without hatching.

As illustrated in FIG. 1, the semiconductor module 1 includes a case 11 that defines a space 111. The case 11 is made of, for example, insulating thermoplastic resin.

The semiconductor module 1 includes the insulating wiring board 13 arranged in the space 111. The insulating wiring board 13 includes an insulating substrate 131 having, for example, a rectangular flat plate shape. The insulating wiring board 13 is, for example, a direct copper bonding (DCB) substrate or an active metal brazing (AMB) substrate. The insulating wiring board 13 includes a plurality of conductive patterns 133a, 133b, and 133c formed on an upper surface (the sealing resin 18 (see below for details) side) of the insulating substrate 131 and a heat transfer member 135 having a rectangular flat plate shape formed on a lower surface (a cooler 19 (see below for details) side) of the insulating substrate 131. The insulating substrate 131 is made of, for example, a ceramic such as alumina ($Al_2O_3$), aluminum nitride (AlN), or silicon nitride (SiN). The conductive patterns 133a, 133b, and 133c and the heat transfer member 135 are made of, for example, copper.

The semiconductor module 1 includes a plurality of sintered bodies 15a, 15b, and 15c formed on the conductive patterns 133a, 133b, and 133c and a plurality of semiconductor chips 14a, 14b, and 14c arranged on the plurality of sintered bodies 15a, 15b, and 15c. The sintered bodies 15a, 15b, and 15c are porous sintered metal layers. Therefore, the semiconductor chip 14a is bonded to the conductive pattern 133a by the sintered body 15a, the semiconductor chip 14b is bonded to the conductive pattern 133b by the sintered body 15b, and the semiconductor chip 14c is bonded to the conductive pattern 133c by the sintered body 15c.

Although details are described below, the present embodiment uses an upper die 3A (not illustrated in FIG. 1; see FIGS. 3 and 4) including protrusions at points corresponding to arrangement positions of the semiconductor chips 14a, 14b, and 14c and a lower die 2, and sinters by pressurizing and heating the sintered materials 151a, 151b, and 151c (not illustrated in FIG. 1; see FIGS. 3 and 4) individually to form the sintered bodies 15a, 15b, and 15c. This allows for uniform pressurization and heating onto the sintered materials 151a, 151b, and 151c for bonding the semiconductor chips 14a, 14b, and 14c to the insulating wiring board 13.

The sintered materials 151a, 151b, and 151c are those prepared by mixing fine metal particles with an organic material coating therearound into an organic solvent. By pressurizing and heating the sintered materials 151a, 151b, and 151c arranged between the objects to be bonded, the organic solvent and the coated organic material vaporize, and the exposed fine metal particles fuse with each other to form the porous sintered bodies 15a, 15b, and 15c. Examples of the metal particles to be used include silver (Ag) or copper (Cu) having a particle diameter of several micrometers to several tens of micrometers. The sintered materials 151a, 151b, and 151c are, for example, silver-based sintered materials or copper-based sintered materials, and have a thermal conductivity of about from 200 W/mK to 300 W/mK (pure silver: about 400 W/mK), a thermal expansion coefficient of about $20 \times 10^{-6}/^\circ$ C., and a melting point of about 960° C. Therefore, the sintered bodies 15a, 15b, and 15c formed by sintering the sintered materials 151a, 151b, and 151c exhibit stable strength at operating temperatures for the semiconductor module 1 (e.g., from 150° C. to 170° C.).

The semiconductor chip 14a is connected to a terminal 16a provided on a case 11 by a bonding wire 17a. The semiconductor chip 14b is connected to a terminal (not illustrated) provided on the case 11 by a bonding wire 17b. The semiconductor chip 14c is connected to a terminal (not illustrated) provided on the case 11 by a bonding wire 17c. The conductive pattern 133a is connected to a terminal 16b provided on the case 11 by a bonding wire 17d. The conductive pattern 133b is connected to a terminal (not illustrated) provided on the case 11 by a bonding wire 17e. The conductive pattern 133c is connected to a terminal (not illustrated) provided on the case 11 by a bonding wire 17f. Further, in FIG. 1, illustration of bonding wires for gate control is omitted. Alternatively, a lead frame is used instead of each bonding wire.

On the semiconductor chips 14a, 14b, and 14c are formed power semiconductor elements such as, for example, insulated gate bipolar transistors (IGBTs) and/or metal-oxide-semiconductor field-effect transistors (MOSFETs). Therefore, a control signal from a controller (not illustrated) included in the semiconductor module 1 is input to the power semiconductor elements formed on the semiconductor chips 14a, 14b, and 14c via the terminal 16a, other terminals, and the bonding wires for gate control (not illustrated). As a result, the power semiconductor elements are on-off controlled at predetermined timings to convert, for example, DC power input from an outside to AC power and output to the conductive patterns 133a, 133b, and 133c. The semiconductor module 1 outputs the AC power input to the conductive patterns 133a, 133b, and 133c from the semiconductor chips 14a, 14b, and 14c via the sintered materials 15a, 15b, and 15c to an unillustrated load (e.g., a motor) via the bonding wires 17d, 17e, and 17f, the terminal 16b, and the other terminals. This allows the semiconductor module 1 to drive the load with the AC power generated by the semiconductor chips 14a, 14b, and 14c.

The semiconductor module 1 includes the cooler 19 attached to the case 11. The heat transfer member 135 is connected to the cooler 19 by a bonding layer 12 formed by, for example, a sintered material. Alternatively, the heat transfer member 135 may be connected to the cooler 19 by a solder material. Heat generated during operation of the power semiconductor elements formed on the semiconductor chips 14a, 14b, and 14c is dissipated to the outside through the heat transfer member 135 and the cooler 19. As a result, the semiconductor module 1 can prevent thermal runaway in the power semiconductor elements formed on the semiconductor chips 14a, 14b, and 14c.

The semiconductor module 1 includes the sealing resin 18 formed in the space 111 to cover the insulating wiring board 13, the sintered materials 15a, 15b, and 15c, the semiconductor chips 14a, 14b, and 14c, and the bonding wires 17a, 17b, 17c, 17d, 17e, and 17f. The sealing resin 18 passes between the case 11 and the insulating substrate 131, and is formed also in a region surrounded by the case 11, the insulating wiring board 13, and the heat transfer member 135. The sealing resin 18 is made of a material different from that of the case 11, such as, for example, epoxy resin. The sealing resin 18 is a sealing member that seals components such as the semiconductor chips 14a, 14b, and 14c and the insulating wiring board 13 provided in the space 111. The sealing resin 18 can improve electrical insulation between the conductive patterns 133a, 133b, and 133c formed on the insulating wiring board 13 by sealing the insulating wiring board 13. This allows the sealing resin 18 to improve reliability of the semiconductor module 1.

In FIG. 1, the three semiconductor chips 14a, 14b, and 14c are arranged side by side above the insulating wiring board 13. However, the number of semiconductor chips to be arranged above the insulating wiring board 13 and the number and shape of conductive patterns to be formed on the insulating wiring board 13 are not limited to those illustrated in FIG. 1. Further, although FIG. 1 illustrates the single insulating wiring board 13 arranged in the case 11, the number of insulating wiring boards 13 is not limited to one, and a plurality of insulating wiring boards 13 may be arranged in the case 11.

(Method for Manufacturing Semiconductor Module)

Figure 2:
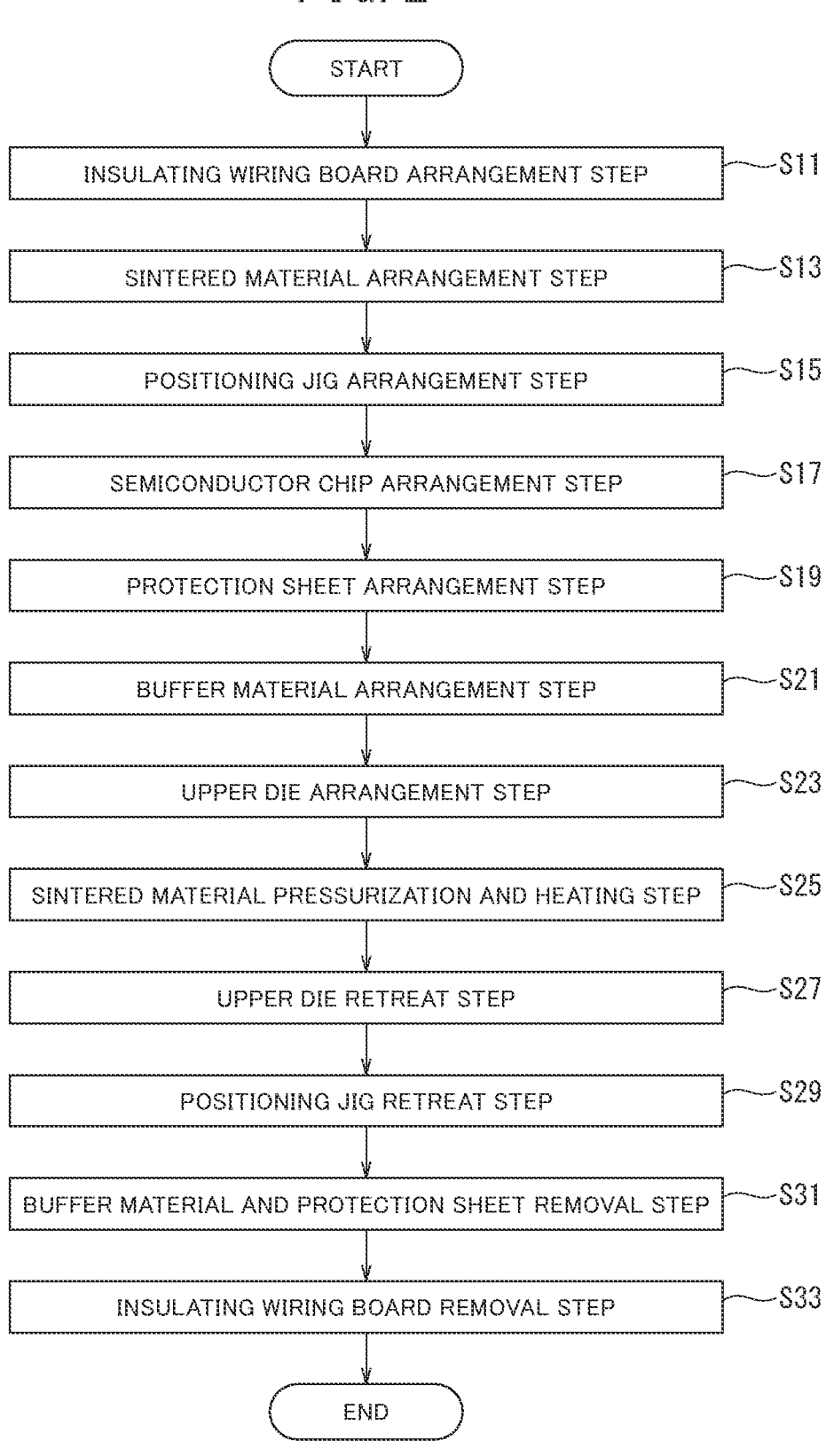
FIG. 2 is a flowchart illustrating an example of a flow of the method for manufacturing a semiconductor module according to Embodiment 1 of the present invention.

Next, the method for manufacturing a semiconductor module according to the present embodiment is described using FIGS. 2 to 6. The method for manufacturing a semiconductor module according to the present embodiment is described by exemplifying a method for manufacturing the semiconductor module 1 illustrated in FIG. 1. FIG. 2 illustrates an example of a flow of steps of bonding the semiconductor chips 14a, 14b, and 14c to the insulating wiring board 13 in the method for manufacturing the semiconductor module according to the present embodiment.

As illustrated in FIG. 2, at step S11 in the method for manufacturing the semiconductor module 1 according to the present embodiment, a step of arranging the insulating wiring board 13 is executed. Specifically, at step S11, the insulating wiring board 13 is arranged on the lower die 2 (see FIG. 3) having a flat plate shape. The lower die 2 is made of, for example, a metal material or a ceramic material (e.g., silicon nitride or the like) for dies. The lower die 2 is attached to a device for manufacturing the semiconductor module 1. The lower die 2 is heated before arranging the insulating wiring board 13 in order to apply heat to the sintered materials 151a, 151b, and 151c at a later step, and has a temperature of, for example, 250° C. or higher. The lower die 2 may be attached to the manufacturing device after being heated or may be heated by the manufacturing device.

Figure 3:
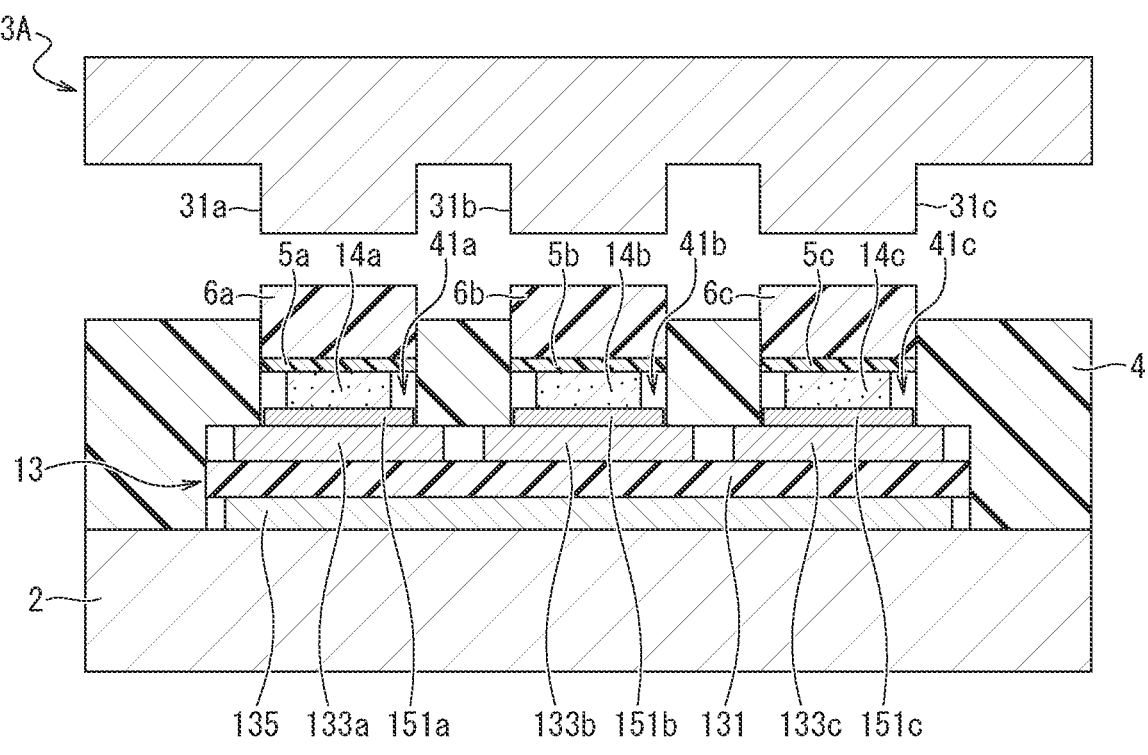
FIG. 3 is a diagram schematically illustrating steps of arranging buffer materials and protection sheets in the method for manufacturing a semiconductor module according to Embodiment 1 of the present invention.

At step S13 following step S11, a sintered material arrangement step is executed. Specifically, at step S13, the sintered materials 151a, 151b, and 151c are arranged at a plurality of points on the insulating wiring board 13, as illustrated in FIG. 3. The sintered material 151a is arranged by being formed in an opening portion 41a formed in a positioning jig 4, the sintered material 151b is arranged by being formed in an opening portion 41b formed in the positioning jig 4, and the sintered material 151c is arranged by being formed in an opening portion 41c formed in the positioning jig 4. The sintered materials 151a, 151b, and 151c arranged on the insulating wiring board 13 are in paste or sheet form. In the present embodiment, the sintered materials 151a, 151b, and 151c are, for example, in paste form.

At step S15 following step S13, a positioning jig arrangement step is executed. Specifically, at step S15, the positioning jig 4 including the opening portions 41a, 41b, and 41c (see FIG. 3) at points corresponding to arrangement positions where the plurality of semiconductor chips 14a, 14b, and 14c is arranged on the insulating wiring board 13 before arranging the plurality of semiconductor chips 14a, 14b, and 14c on the plurality of sintered materials 151a, 151b, and 151c (see FIG. 3). As a result, the insulating wiring board 13 is secured at a predetermined place above the lower die 2 by the positioning jig 4. The positioning jig 4 is, for example, a carbon or ceramic jig having high heat resistance and low thermal expansion coefficient so as not to be deformed at temperature applied during sintering of the sintered materials 151a, 151b, and 151c.

At step S17 following step S15, a semiconductor chip forming step is executed. Specifically, at step S17, as illustrated in FIG. 3, the semiconductor chips 14a, 14b, and 14c are each arranged on the plurality of sintered materials 151a, 151b, and 151c. The semiconductor chip 14a is arranged on the sintered material 151a in the opening portion 41a, the semiconductor chip 14b is arranged on the sintered material 151b in the opening portion 41b, and the semiconductor chip 14c is arranged on the sintered material 151c in the opening portion 41c.

At step S19 following step S17, a protection sheet arrangement step is executed. Specifically, at step S19, as illustrated in FIG. 3, protection sheets 5a, 5b, and 5c are each arranged on the semiconductor chips 14a, 14b, and 14c. The protection sheet 5a is arranged on the semiconductor chip 14a in the opening portion 41a, the protection sheet 5b is arranged on the semiconductor chip 14b in the opening portion 41b, and the protection sheet 5c is arranged on the semiconductor chip 14c in the opening portion 41c. The protection sheets 5a, 5b, and 5c are made of, for example, fluororesin (e.g., polytetrafluoroethylene (PTFE)), and have a thickness of, for example, from 0.1 mm to 0.5 mm.

At step S21 following step S19, a buffer material arrangement step is executed. Specifically, at step S21, buffer materials 6a, 6b, and 6c are each individually arranged above the plurality of semiconductor chips 14a, 14b, and 14c. The buffer material 6a is arranged on the protection sheet 5a in the opening portion 41a, the buffer material 6b is arranged on the protection sheet 5b in the opening portion 41b, and the buffer material 6c is arranged on the protection sheet 5c in the opening portion 41c. Accordingly, the buffer material 6a is arranged above the semiconductor chip 14a through the protection sheet 5a, the buffer material 6b is arranged above the semiconductor chip 14b through the protection sheet 5b, and the buffer material 6c is arranged above the semiconductor chip 14c through the protection sheet 5c. Thus, in the present embodiment, the buffer materials 6a, 6b, and 6c are separated from each other.

The buffer materials 6a, 6b, and 6c are composed of, for example, a carbon sheet or the like having low elastic modulus even during sintering of the sintered materials 151a, 151b, and 151c. The buffer materials 6a, 6b, and 6c have a heat resistance of 250° C. or higher, a Poisson's ratio of 0.2 or less, a hardness of 80 points±5% on a type A durometer according to JIS K 6253, and a thickness of 1.5 mm or more. Since the buffer materials 6a, 6b, and 6c have a hardness of 80 points±5% on a type A durometer according to JIS K 6253, the buffer materials 6a, 6b, and 6c can be prevented from breaking through the protection sheets 5a, 5b, and 5c to damage the semiconductor chips 14a, 14b, and 14c during sintering of the sintered materials 151a, 151b, and 151c. Since the buffer materials 6a, 6b, and 6c have a thickness of 1.5 mm or more, a difference in height (e.g., a difference smaller than 10 μm) between surfaces of the semiconductor chips 14a, 14b, and 14c facing the buffer materials 6a, 6b, and 6c sides is absorbed, enabling application of a substantially uniform pressure to the sintered materials 151a, 151b, and 151c. In addition, the buffer materials 6a, 6b, and 6c have a compressive elastic modulus of 9 MPa at a temperature of 250° C. More specific functions and effects of the buffer materials 6a, 6b, and 6c are described later.

At step S23 following step S21, an upper die arrangement step is executed. Specifically, at step S23, as illustrated in FIG. 3, the upper die 3A including protrusions 31a, 31b, and 31c at points corresponding to arrangement positions of the plurality of semiconductor chips 14a, 14b and 14c is arranged above the lower die 2 so that the plurality of protrusions 31a, 31b, and 31c correspond to the plurality of semiconductor chips 14a, 14b, and 14c. Since the buffer materials 6a, 6b, and 6c are arranged above the semiconductor chips 14a, 14b, and 14c, the upper die 3A is arranged above the lower die 2 in a state where the protrusion 31a faces the buffer material 6a, the protrusion 31b faces the buffer material 6b, and the protrusion 31c faces the buffer material 6c. The upper die 3A is attached to the device for manufacturing the semiconductor module 1 to which the lower die 2 is attached.

The protrusion 31a is large enough to be inserted into the opening portion 41a of the positioning jig 4. The protrusion 31b is large enough to be inserted into the opening portion 41b of the positioning jig 4. The protrusion 31c is large enough to be inserted into the opening portion 41c of the positioning jig 4. Therefore, the upper die 3A can pressurize the sintered materials 151a, 151b, and 151c in a state where the protrusions 31a, 31b, and 31c are inserted into the opening portions 41a, 41b, and 41c during sintering of the sintered materials 151a, 151b, and 151c.

The upper die 3A is made of, for example, a metal material or a ceramic material (e.g., silicon nitride or the like) for dies, which is the same as that of the lower die 2. The upper die 3A may be made of a metal material different from that of the lower die 2. The upper die 3A is heated before being arranged above the lower die 2 in order to apply heat to the sintered materials 151a, 151b, and 151c at a later step, and has a temperature of, for example, 250° C. or higher. Therefore, the protrusions 31a, 31b, and 31c also have a temperature of, for example, 250° C. or higher. The upper die 3A may be attached to the device for manufacturing the semiconductor module 1 after being heated or may be heated by the manufacturing device.

Figure 4:
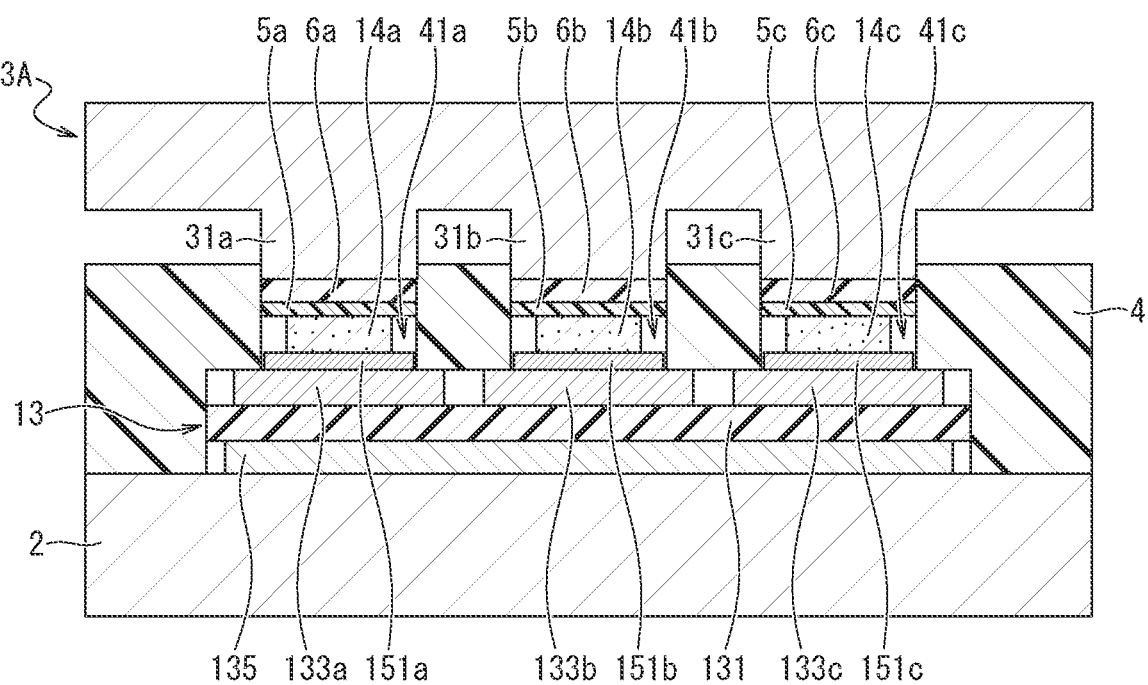
FIG. 4 is a diagram schematically illustrating steps of pressurizing and heating sintered materials in the method for manufacturing a semiconductor module according to Embodiment 1 of the present invention.

At step S25 following step S23, a sintered material pressurization and heating step is executed. Specifically, at step S25, as illustrated in FIG. 4, the plurality of sintered materials 151a, 151b, and 151c are sintered by being pressurized and heated by the protrusions 31a, 31b, and 31c through the plurality of buffer materials 6a, 6b, and 6c and the plurality of semiconductor chips 14a, 14b, and 14c. In the present embodiment, the protection sheets 5a, 5b, and 5c are arranged between the semiconductor chips 14a, 14b, and 14c and the buffer materials 6a, 6b, and 6c. Thus, the protrusions 31a, 31b, and 31c pressurize and heat the sintered materials 151a, 151b, and 151c through the buffer materials 6a, 6b, and 6c, the protection sheets 5a, 5b, and 5c, and the semiconductor chips 14a, 14b, and 14c.

In the sintered material pressurization and heating step, the lower die 2 supports the insulating wiring board 13 from the heat transfer member 135 side while securing the insulating wiring board 13. Further, the lower die 2 has a temperature of, for example, 250° C. or higher. Therefore, in the sintered material pressurization and heating step, the lower die 2 pressurizes and heats the sintered materials 151a, 151b, and 151c through the insulating wiring board 13. Thus, the sintered materials 151a, 151b, and 151c are sintered, for example, at a pressure of from 10 MPa to 50 MPa and a temperature of from 200° C. to 300° C. applied by the upper die 3A and the lower die 2.

The buffer materials 6a, 6b, and 6c are arranged to protrude from the positioning jig 4 (see FIG. 3) before pressurizing the sintered materials 151a, 151b, and 151c. However, when pressurizing and heating the sintered materials 151a, 151b, and 151c, the buffer materials 6a, 6b, and 6c are compressed until the entirety thereof enter the opening portions 41a, 41b, and 41c of the positioning jig 4.

The buffer materials 6a, 6b, and 6c have low elastic modulus even during the sintering thereof. Therefore, compressing the buffer materials 6a, 6b, and 6c in the sintered material pressurization and heating step can absorb height tolerance of each of the surfaces of the semiconductor chips 14a, 14b, and 14c facing the buffer materials 6a, 6b, and 6c. Here, the surfaces of the semiconductor chips 14a, 14b, and 14c facing the buffer materials 6a, 6b, and 6c are those of the semiconductor chips 14a, 14b, and 14c in contact with the protection sheets 5a, 5b, and 5c. Further, the height of each of the surfaces of the semiconductor chips 14a, 14b, and 14c correspond to, for example, a distance from a surface of the insulating substrate 131 on which the plurality of conductive patterns 133a, 133b, and 133c are formed.

Further, in the sintered material pressurization and heating step, force is applied to the buffer materials 6a, 6b, and 6c in a direction (vertical direction) in which the insulating wiring board 13, the semiconductor chips 14a, 14b, and 14c, the protection sheets 5a, 5b, and 5c, and the buffer materials 6a, 6b, and 6c are stacked. Therefore, the buffer materials 6a, 6b, and 6c apply force, with the same force as the above force, in a direction (lateral direction) parallel to an in-plane of the insulating wiring board 13. Around the buffer materials 6a, 6b, and 6c are arranged sidewalls forming the opening portions 41a, 41b, and 41c of the positioning jig 4. Accordingly, in the sintered material pressurization and heating step, the buffer materials 6a, 6b, and 6c apply force to the sidewalls forming the opening portions 41a, 41b, and 41c in a direction widening the opening portions 41a, 41b, and 41c of the positioning jig 4. Further, when the buffer materials 6a, 6b, and 6c widen the opening portions 41a, 41b, and 41c, the sidewalls forming those adjacent to each other among the opening portions 41a, 41b, and 41c of the positioning jig 4 exert force on each other. This leads to non-uniform bonding pressurization to each of the semiconductor chips 14a, 14b, and 14c, which may reduce bonding quality between the semiconductor chips 14a, 14b, and 14c and the conductive patterns 133a, 133b, and 133c.

As described above, the buffer materials 6a, 6b, and 6c have a Poisson's ratio of 0.2 or less. Therefore, the buffer materials 6a, 6b, and 6c are characterized by being hard to spread laterally. When pressurized vertically, the buffer materials 6a, 6b, and 6c apply a weaker force to the sidewalls forming the opening portions 41a, 41b, and 41c of the positioning jig 4 than buffer materials made of a material having a Poisson's ratio greater than, for example, 0.2. Thus, since the positioning jig 4 can be fabricated with an inexpensive material having low hardness, the semiconductor module 1 can be manufactured at low cost.

Applying pressure and heat to the sintered materials 151a, 151b, and 151c by the upper die 3A and the lower die 2 facilitates sintering reaction in the sintered materials 151a,

151b, and 151c. This results in formation of the sintered materials 15a, 15b, and 15c that have sintered bodies composed by bonding of silver particles or copper particles contained in the sintered materials 151a, 151b, and 151c in paste or sheet form and that are conductive.

At step S27 following step S25, an upper die retreat step is executed. Specifically, at step S27, the protrusions 31a, 31b, and 31c of the upper die 3A are pulled out from the opening portions 41a, 41b, and 41c of the positioning jig 4, and are retreated, for example, above the lower die 2 (see FIG. 5).

Figure 5:
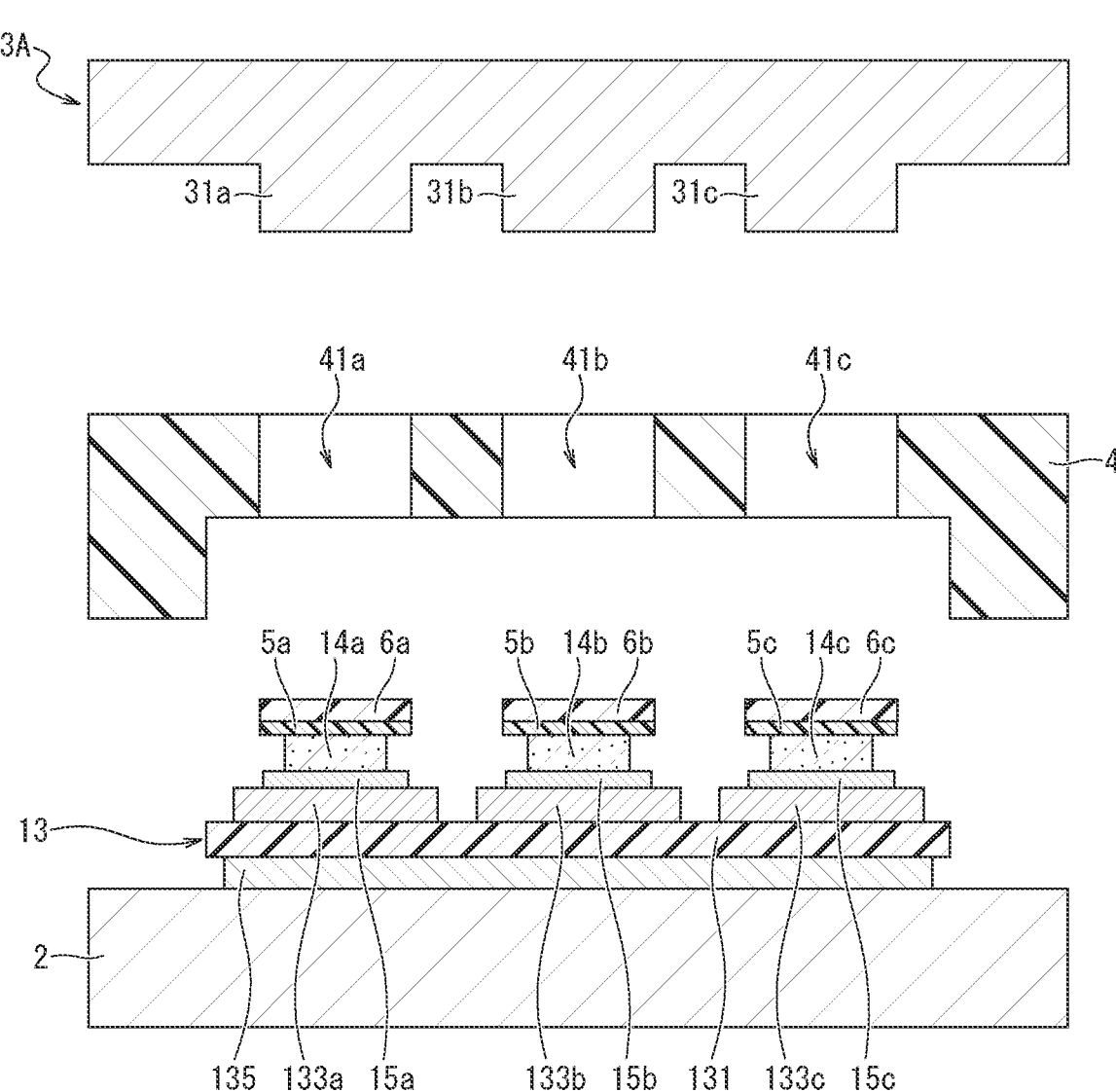
FIG. 5 is a diagram schematically illustrating steps of retreating an upper die and a positioning jig in the method for manufacturing a semiconductor module according to Embodiment 1 of the present invention.

At step S29 following step S27, a positioning jig retreat step is executed. Specifically, at step S29, as illustrated in FIG. 5, the positioning jig 4 is retreated, for example, above the lower die 2 in a state where the insulating wiring board 13 and the like are left on the lower die 2. Above the insulating wiring board 13 after the retreat of the positioning jig 4 are left the semiconductor chips 14a, 14b, and 14c, the protection sheets 5a, 5b, and 5c, and the buffer materials 6a, 6b, and 6c.

Figure 6:
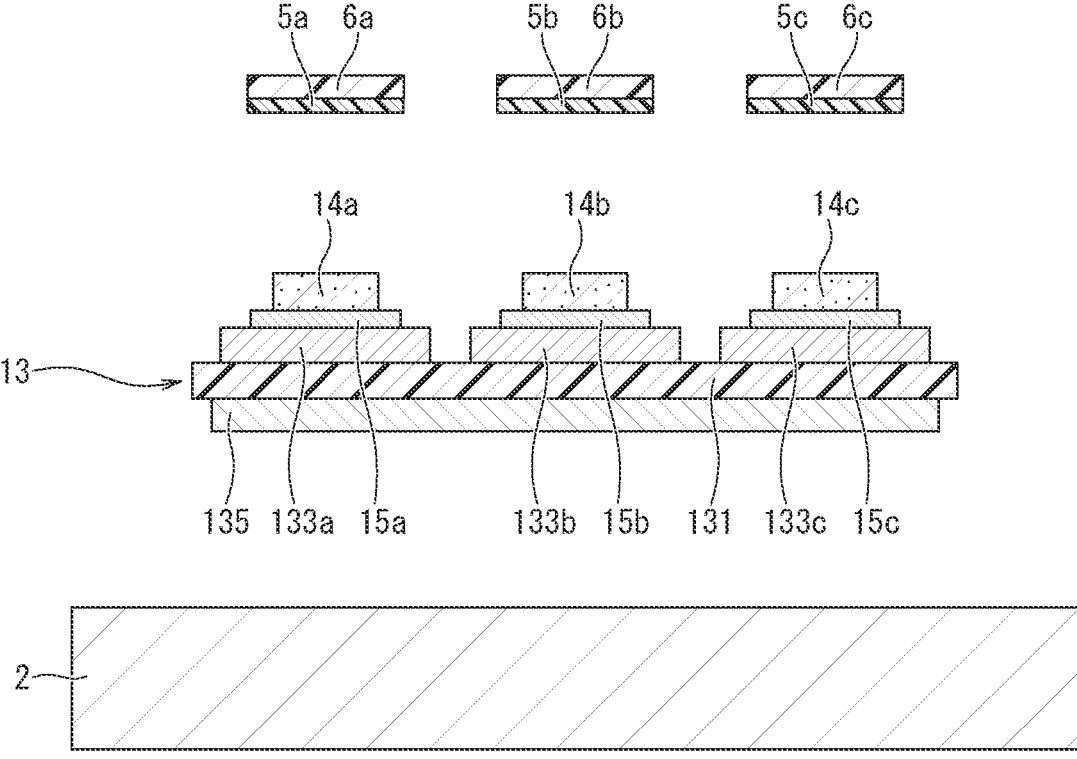
FIG. 6 is a diagram schematically illustrating a buffer material and protection sheet removal step and an insulating wiring board removal step in the method for manufacturing a semiconductor module according to Embodiment 1 of the present invention.

At step S31 following step S29, a buffer material and protection sheet removal step is executed. Specifically, at step S31, the buffer materials 6a, 6b, and 6c and the protection sheets 5a, 5b, and 5c are removed, as illustrated in FIG. 6. This leaves the semiconductor chips 14a, 14b, and 14c bonded to the conductive patterns 133a, 133b, and 133c by the sintered bodies 15a, 15b, and 15c on the insulating wiring board 13.

At step S33 following step S31, an insulating wiring board removal step is executed. Specifically, at step S33, as illustrated in FIG. 6, the insulating wiring board 13 including the semiconductor chips 14a, 14b, and 14c bonded to the conductive patterns 133a, 133b, and 133c by the sintered bodies 15a, 15b, and 15c are removed from the lower die 2. This completes the steps of bonding the semiconductor chips 14a, 14b, and 14c to the insulating wiring board 13.

Although illustration is omitted, as illustrated in FIG. 1, the insulating wiring board 13 with the semiconductor chips 14a, 14b, and 14c bonded thereto is arranged in the space 111 of the case 11 with the cooler 19 attached thereto. Next, the semiconductor chips 14a, 14b, and 14c are connected to the terminal 16a and the like arranged in the case 11 by the bonding wires 17a, 17b, and 17c, and the conductive patterns 133a, 133b, and 133c are connected to the terminal 16b and the like arranged in the case 11 by the bonding wires 17d, 17e, and 17f. Then, the sealing resin 18 is poured into the space 111 to cover the semiconductor chips 14a, 14b, and 14c, the bonding wires 17a, 17b, 17c, 17d, 17e, and 17f, and the conductive patterns 133a, 133b, and 133c. This completes the semiconductor module 1.

(Effects of Method for Manufacturing Semiconductor Module)

Next, effects of the method for manufacturing a semiconductor module according to the present embodiment are described using FIGS. 7 to 12 with reference to FIGS. 3 and 4.

Comparative Example 1

Figure 7:
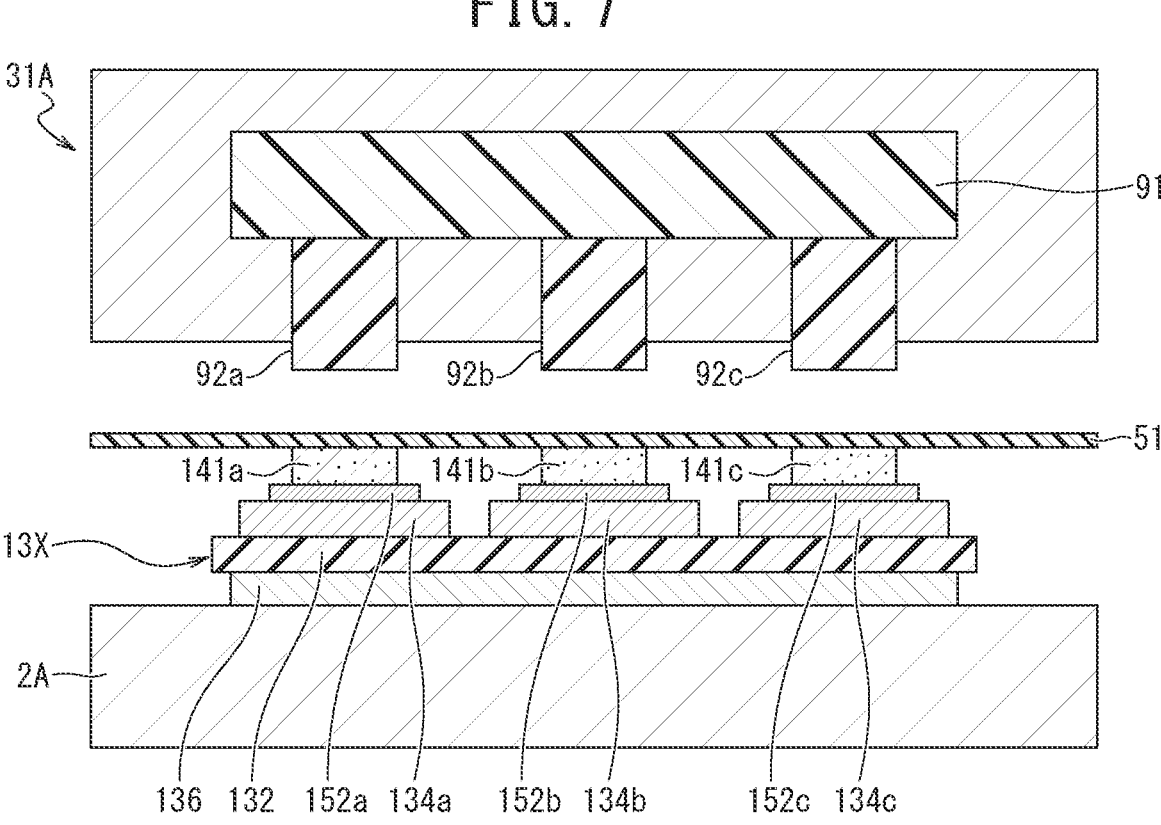
FIG. 7 is a diagram schematically illustrating a step of arranging a sintered material pressurizing and heating mechanism in a method for manufacturing a semiconductor module according to Comparative Example 1.
Figure 8:
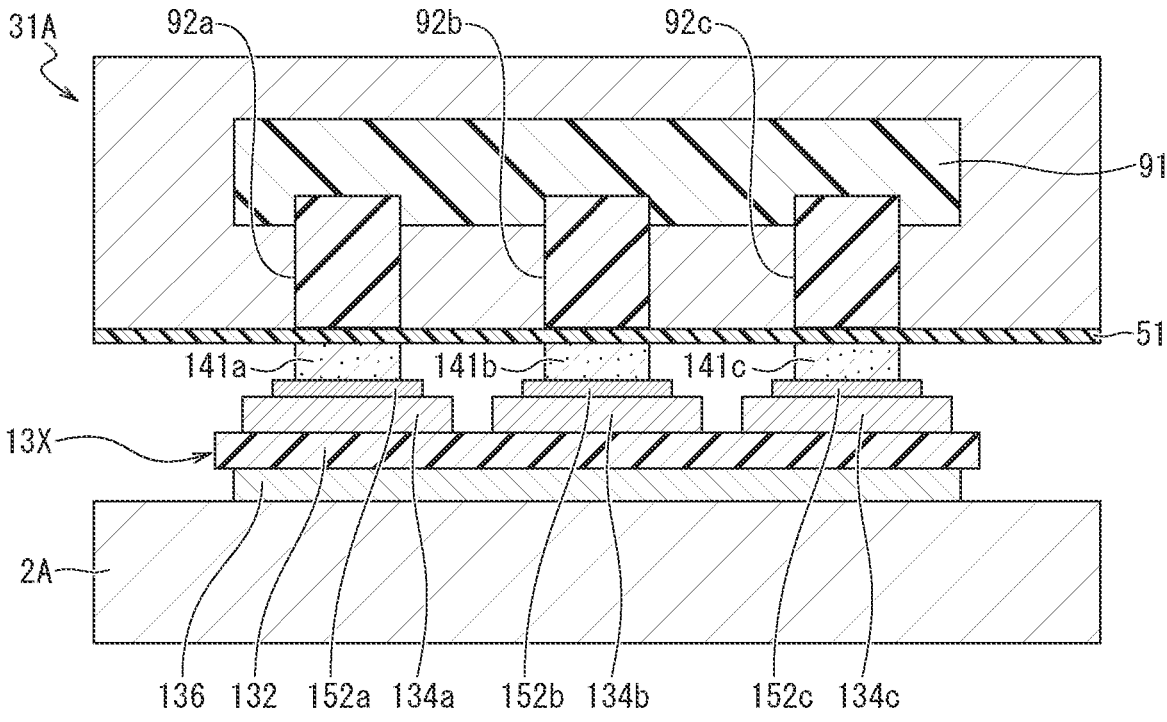
FIG. 8 is a diagram schematically illustrating a sintered material pressurization and heating step in the method for manufacturing a semiconductor module according to Comparative Example 1.

FIGS. 7 and 8 are diagrams for illustrating a sintered material pressurization and heating step in a method for manufacturing a semiconductor module according to Comparative Example 1.

As illustrated in FIG. 7, in the method for manufacturing a semiconductor module according to Comparative Example 1, an insulating wiring board 13X is arranged on a lower die 2A having the same action and function as those of the lower die 2 in the present embodiment. Similarly to the insulating wiring board 13 in the present embodiment, the insulating wiring board 13X includes an insulating substrate 132, conductive patterns 134a, 134b, and 134c formed on one surface of the insulating substrate 132, and a heat transfer member 136 formed on the other surface of the insulating substrate 132. The insulating substrate 132 has the same action and function as those of the insulating substrate 131 in the present embodiment. The conductive patterns 134a, 134b, and 134c have the same action and function as those of the conducive patterns 133a, 133b, and 133c in the present embodiment. The heat transfer member 136 has the same action and function as those of the heat transfer member 135 in the present embodiment. The insulating wiring board 13X is arranged on the lower die 2A with the heat transfer member 136 facing the lower die 2A side.

Next, as illustrated in FIG. 7, sintered materials 152a, 152b, and 152c are formed at predetermined points of the conductive patterns 134a, 134b, and 134c. The sintered materials 152a, 152b, and 152c have the same action and function as those of the sintered materials 151a, 151b, and 151c in the present embodiment.

Then, as illustrated in FIG. 7, semiconductor chips 141a, 141b, and 141c are arranged on the sintered materials 152a, 152b, and 152c. The semiconductor chips 141a, 141b, and 141c have the same action and function as those of the semiconductor chips 14a, 14b, and 14c in the present embodiment.

Next, as illustrated in FIG. 7, on the semiconductor chips 141a, 141b, and 141c is arranged a single protection sheet 51 that is large enough to cover an entire surface above the insulating wiring board 13X. The protection sheet 51 is arranged in contact with upper surfaces of the semiconductor chips 141a, 141b, and 141c.

Then, as illustrated in FIG. 7, the upper die 31A is arranged to face the lower die 2A above the lower die 2A with the insulating wiring board 13X and the like therebetween. The upper die 31A according to Comparative Example 1 includes a pressurization mechanism 91 thereinside. The pressurization mechanism 91 has low elastic modulus, as in the buffer materials 6a, 6b, and 6c in the present embodiment. The upper die 31A includes individual pressurization portions 92a, 92b, and 92c whose one ends are in contact with the pressurization mechanism 91 and whose other ends protrude from the upper die 31A. The individual pressurization portions 92a, 92b, and 92c protrude toward the lower die 2A side when the upper die 31A is arranged to face the lower die 2A. The individual pressurization portions 92a, 92b, and 92c are arranged to correspond to arrangement positions of the semiconductor chips 141a, 141b, and 141c. Therefore, when the upper die 31A is arranged to face the lower die 2A with the insulating wiring board 13X therebetween, the individual pressurization portion 92a is arranged to face the semiconductor chip 141a with the protection sheet 51 therebetween, the individual pressurization portion 92b is arranged to face the semiconductor chip 141b with the protection sheet 51 therebetween, and the individual pressurization portion 92c is arranged to face the semiconductor chip 141c with the protection sheet 51 therebetween.

Next, as illustrated in FIG. 8, the sintered materials 152a, 152b, and 152c are pressurized by the upper die 31A and the lower die 2A. When the upper die 31A descends toward the lower die 2A, first, the ends of the individual pressurization portions 92a, 92b, and 92c contact the protection sheet 51. The individual pressurization mechanism 91 is softer than the individual pressurization portions 92a, 92b, and 92c, the semiconductor chips 141a, 141b, and 141c, and the insulating wiring board 13X. Therefore, when the upper die 31A continues to descend even after the ends of the individual pressurization portions 92a, 92b, and 92c contact the protection sheet 51, the individual pressurization portions 92a, 92b, and 92c bite into the pressurization mechanism 91 for the same length as portions protruding from the upper die 31A, as illustrated in FIG. 8. In a state where the surface of the upper die 31A facing the lower die 2A is almost flush with that of the lower die 2A, the upper die 31A pressurizes the sintered materials 152a, 152b, and 152c through the protection sheet 51 and the semiconductor chips 141a, 141b, and 141c.

The upper die 31A and the lower die 2A are heated and have a temperature of, for example, approximately 250° C., similarly to the upper die 3 and the lower die 2 in the present embodiment. This allows the upper die 31A and the lower die 2A to apply heat as well as pressure to the sintered materials 152a, 152b, and 152c. As a result, the sintered materials 152a, 152b, and 152c are sintered to bond the semiconductor chips 141a, 141b, and 141c and the insulating wiring board 13X (specifically, the conductive patterns 134a, 134b, and 134c) together.

Thus, the upper die 31A in Comparative Example 1 can pressurize and heat the sintered materials 152a, 152b, and 152c. However, the upper die 31A has a complicated structure because of a space required to arrange the pressurization mechanism 91 and openings required to arrange the individual pressurization portions 92a, 92b, and 92c. Since it is also necessary to provide the pressurization mechanism 91 in the space of the upper die 31A and provide the individual pressurization portions 92a, 92b, and 92c in the openings of the upper die 31A, the structure and manufacturing of the upper die 31A becomes complicated. In addition, the arrangement positions and number of the semiconductor chips 141a, 141b, and 141c vary for each type of semiconductor module. Therefore, the upper die 31A requires to be fabricated for each type of semiconductor module.

Furtherer, in a case where the upper die 31A is repeatedly used, the same points of the pressurization mechanism 91 are pushed up by the individual pressurization portions 92a, 92b, and 92c. Therefore, due to changes in elastic force over time at the same points of the pressurization mechanism 91, it may be impossible to apply necessary force to the sintered materials 152a, 152b, and 152c. Accordingly, there is a limit to the number of times the pressurization mechanism 91 can be used.

Furthermore, the protection sheet 51 may be broken during pressurization and heating onto the sintered materials 152a, 152b, and 152c. When the broken protection sheet 51 adheres to the insulating wiring board 13X, the upper die 31A, or the like, it takes cost to remove the broken protection sheet 51. Therefore, the protection sheet 51 is hard to be reused, and thus is disposable. As illustrated in FIGS. 7 and 8, the single protection sheet 51 has more regions where the semiconductor chips 141a, 141b, and 141c are not in contact therewith than those where the semiconductor chips 141a, 141b, and 141c are in contact therewith. Accordingly, utilization efficiency of the protection sheet 51 is reduced in the method for manufacturing a semiconductor module according to Comparative Example 1.

Thus, in the method for manufacturing a semiconductor module according to Comparative Example 1, the manufacturing cost of the upper die 31A for use in manufacturing of a semiconductor module, replacement cost of the pressurization mechanism 91, the utilization efficiency and maintenance cost of the protection sheet 51, and the like increase the manufacturing cost of a semiconductor module.

On the other hand, the method for manufacturing a semiconductor module according to the present embodiment can use the upper die 3A with which the protrusions 31a, 31b, and 31c are integrally formed. The upper die 3A also requires to be fabricated for each type of semiconductor module, but is simpler in structure than the upper die 31A, so that the upper die 3A can be fabricated at lower cost than the upper die 31A. Further, in the method for manufacturing a semiconductor module according to the present embodiment, the protection sheets 5a, 5b, and 5c are disposable, but are each arranged for each of the semiconductor chips 14a, 14b, and 14c. Thus, utilization efficiency of the protection sheets 5a, 5b, and 5c is higher than the protection sheet 51 in Comparative Example 1. Furthermore, the buffer material and protection sheet removal step simply removes the protection sheets 5a, 5b, and 5c and the buffer materials 6a, 6b, and 6c having the size of the semiconductor chips 14a, 14b, and 14c. Therefore, the buffer material and protection sheet removal step is not complicated, and maintenance cost can also be significantly reduced.

Accordingly, the method for manufacturing a semiconductor module according to the present embodiment can reduce the manufacturing cost and maintenance cost of a semiconductor module more than the method for manufacturing a semiconductor module according to Comparative Example 1.

Comparative Example 2

Figure 9:
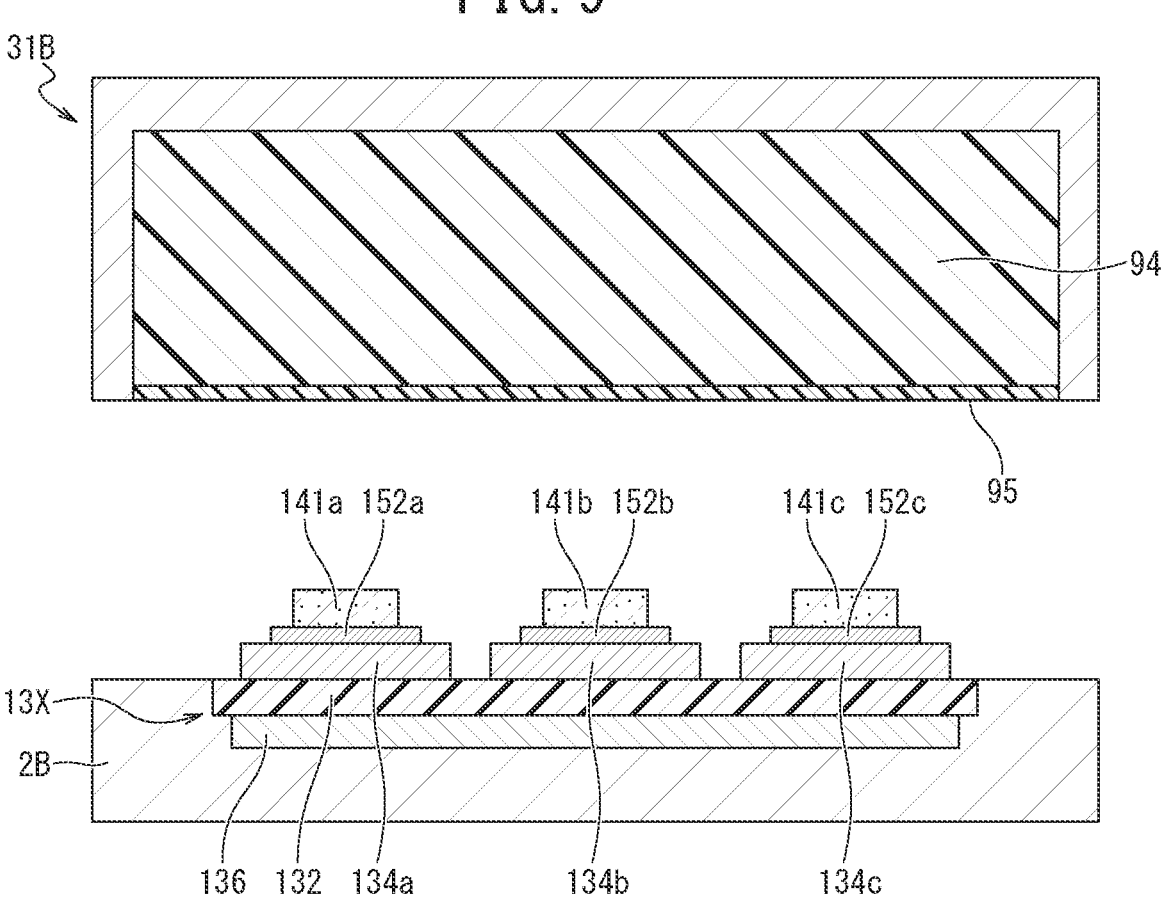
FIG. 9 is a diagram schematically illustrating a step of arranging a sintered material pressurizing and heating mechanism in a method for manufacturing a semiconductor module according to Comparative Example 2.
Figure 10:
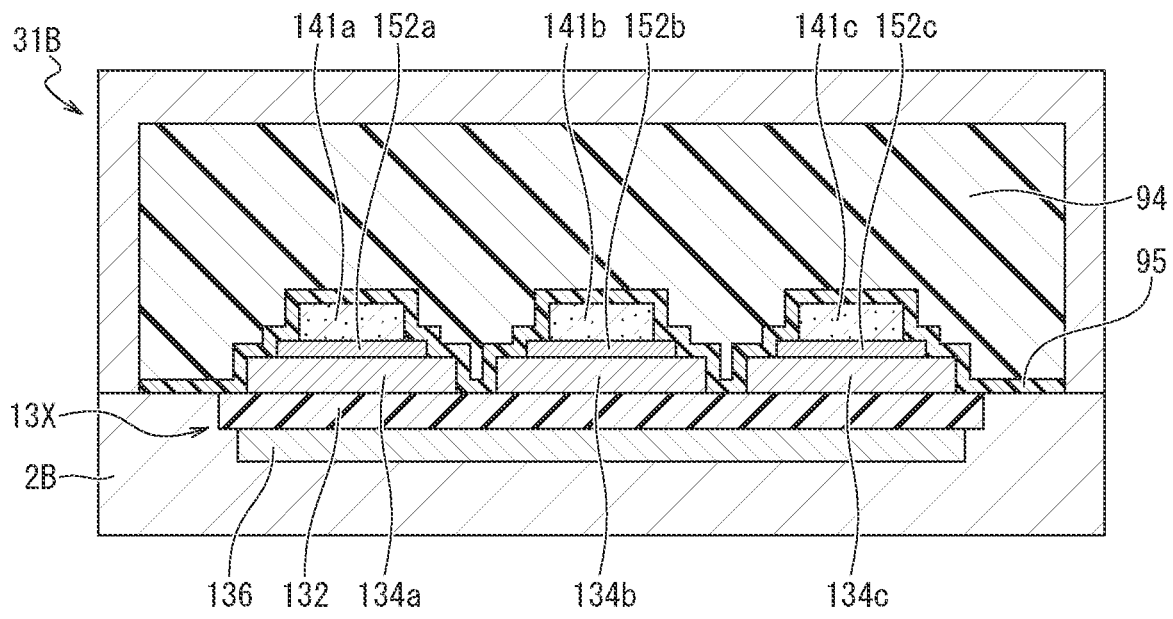
FIG. 10 is a diagram schematically illustrating a sintered material pressurization and heating step in the method for manufacturing a semiconductor module according to Comparative Example 2.

FIGS. 9 and 10 are diagrams for illustrating a sintered material pressurization and heating step in a method for manufacturing a semiconductor module according to Comparative Example 2. An insulating wiring board, sintered materials, and semiconductor chips for use in a semiconductor module manufactured by the method for manufacturing a semiconductor module according to Comparative Example 2 are described using the same reference signs as the insulating wiring board 13X, the sintered materials 152a, 152b, and 152c, and the semiconductor chips 141a, 141b, and 141c in Comparative Example 1.

As illustrated in FIG. 9, in the method for manufacturing a semiconductor module according to Comparative Example 2, the insulating wiring board 13X is arranged on a lower die 2B. The lower die 2B includes a recessed portion for arranging the insulating substrate 132 and the heat transfer member 136 included in the insulating wiring board 13X. Therefore, when the insulating wiring board 13X is arranged on the lower die 2B, the conductive patterns 134a, 134b, and 134c included in the insulating wiring board 13X protrude from the lower die 2B.

Next, as illustrated in FIG. 9, the sintered materials 152a, 152b, and 152c are formed at predetermined points of the conductive patterns 134a, 134b, and 134c, and the semiconductor chips 141a, 141b, and 141c are arranged on the sintered materials 152a, 152b, and 152c.

Then, as illustrated in FIG. 9, an upper die 31B is arranged to face the lower die 2B above the lower die 2B with the insulating wiring board 13X and the like therebetween. The upper die 31B in Comparative Example 2 includes, in a space formed thereinside, a highly fluid elastic body 94 and a sealing sheet 95 that is arranged to close an opening of the space and that seals the elastic body 94 in the space. The upper die 31B is arranged with the sealing sheet 95 facing the lower die 2B.

Then, as illustrated in FIG. 10, the sintered materials 152a, 152b, and 152c are pressurized by the upper die 31B and the lower die 2B. When the upper die 31B descends toward the lower die 2B, the sealing sheet 95 adheres to all surfaces including the semiconductor chips 141a, 141b, and 141c, the sintered materials 152a, 152b, and 152c, and the insulating wiring board 13X. The sealing sheet 95 and the elastic body 94 are more flexible than the semiconductor chips 141a, 141b, and 141c and the insulating wiring board 13X. Therefore, when the upper die 31B is arranged in contact with the lower die 2B, the sealing sheet 95 and the elastic body 94 near the sealing sheet 95 deform, due to their elasticity, into a shape that mimics a shape of the all surfaces including the insulating wiring board 13X and the like. This allows the elastic body 94 to pressurize the sintered materials 152a, 152b, and 152c through the sealing sheet 95.

The upper die 31B and the lower die 2B are heated and have a temperature of, for example, approximately 250° C., similarly to the upper die 3 and the lower die 2 in the present embodiment. Therefore, the upper die 31B and the lower die 2B can apply heat as well as pressure to the sintered materials 152a, 152b, and 152c. As a result, the sintered materials 152a, 152b, and 152c are sintered to bond the semiconductor chips 141a, 141b, and 141c and the insulating wiring board 13X (specifically, the conductive patterns 134a, 134b, and 134c) together.

Thus, the upper die 31B in Comparative Example 2 can pressurize and heat the sintered materials 152a, 152b, and 152c. In the method for manufacturing a semiconductor module according to Comparative Example 2, the conductive patterns 134a, 134b, and 134c and the semiconductor chips 141a, 141b, and 141c bite into the elastic body 94 during pressurization and heating onto the sintered materials 152a, 152b, and 152c. As a result, the elastic body 94 tries to spread outward based on sizes of the conductive patterns 134a 134b and 134c and of the semiconductor chips 141a, 141b, and 141c. Therefore, the upper die 31B requires to be large enough and strong enough to withstand an internal pressure at which the elastic body 94 tries to spread outward. This leads to expensive fabrication cost of the upper die 31B, increasing manufacturing cost of a semiconductor module.

On the other hand, the method for manufacturing a semiconductor module according to the present embodiment can use the upper die 3A with which the integrally formed protrusions 31a, 31b, and 31c, as described above. Thus, the method for manufacturing a semiconductor module according to the present embodiment can use the upper die 3A simple in structure, and therefore can achieve lower manufacturing equipment cost for and lower manufacturing cost of semiconductor modules than in the method for manufacturing a semiconductor module according to Comparative Example 2.

Comparative Example 3

Figure 11:
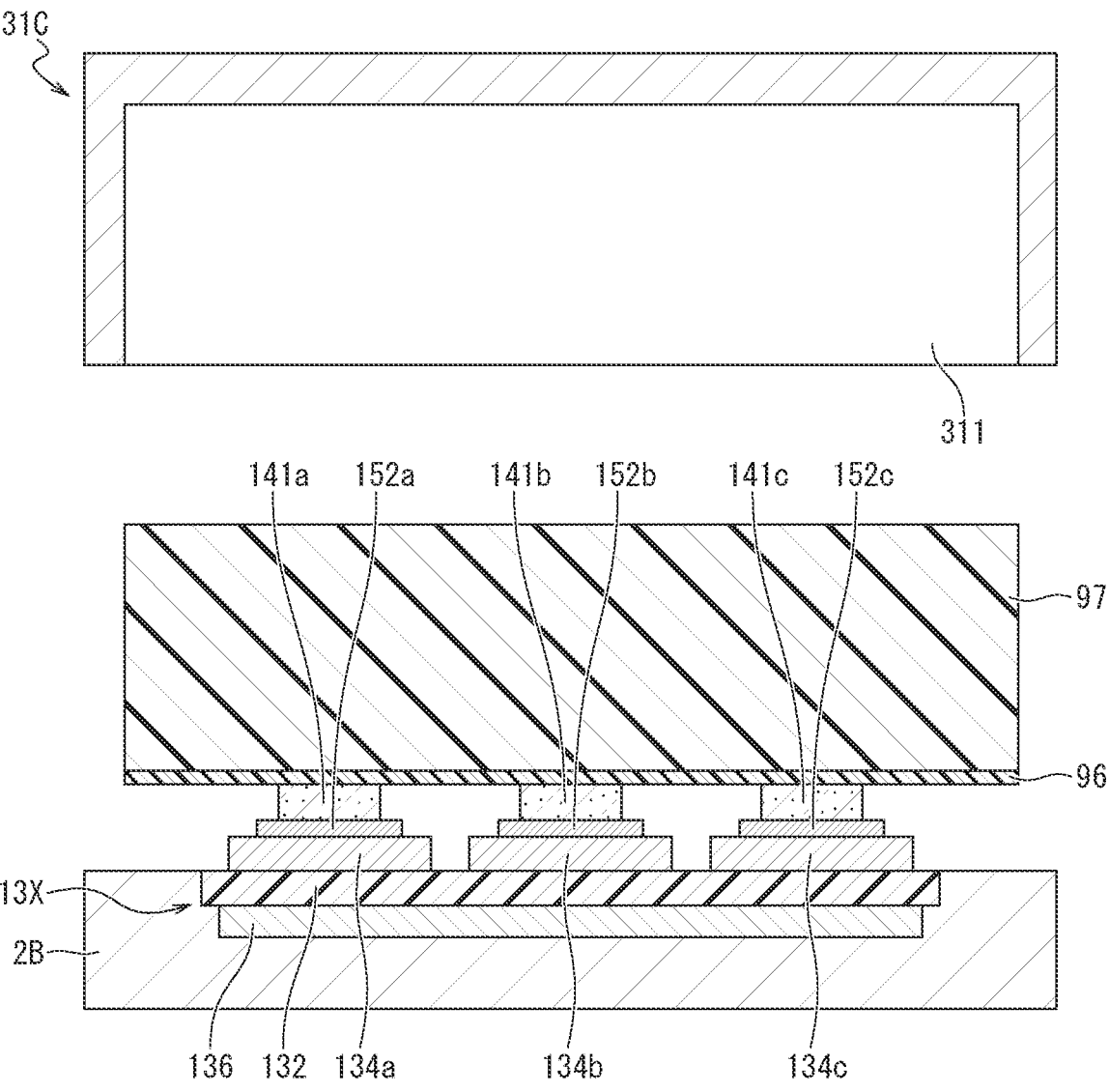
FIG. 11 is a diagram schematically illustrating a step of arranging a sintered material pressurizing and heating mechanism in a method for manufacturing a semiconductor module according to Comparative Example 3.
Figure 12:
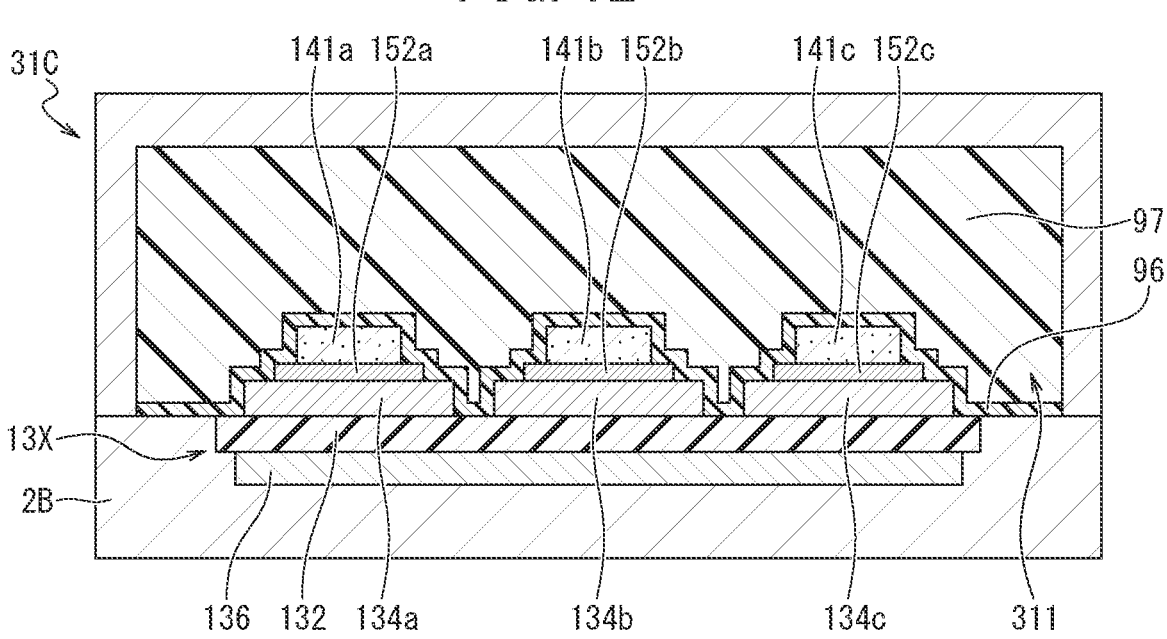
FIG. 12 is a diagram schematically illustrating a sintered material pressurization and heating step in the method for manufacturing a semiconductor module according to Comparative Example 3.

FIGS. 11 and 12 are diagrams for illustrating a sintered material pressurization and heating step in a method for manufacturing a semiconductor module according to Comparative Example 3. An insulating wiring board, sintered materials, and semiconductor chips for use in a semiconductor module manufactured by the method for manufacturing a semiconductor module according to Comparative Example 3 are described using the same reference signs as the insulating wiring board 13X, the sintered materials 152a, 152b, and 152c and the semiconductor chips 141a, 141b, and 141c in Comparative Example 1.

As illustrated in FIG. 11, in the method for manufacturing a semiconductor module according to Comparative Example 3, the insulating wiring board 13X is arranged on the lower die 2B having the same structure as the lower die 2B in Comparative Example 2. Therefore, when the insulating wiring board 13X is arranged on the lower die 2B, the conductive patterns 134a, 134b, and 134c included in the insulating wiring board 13X protrude from the lower die 2B.

Then, as illustrated in FIG. 11, the sintered materials 152a, 152b, and 152c are formed at predetermined points of the conductive patterns 134a, 134b, and 134c, and the semiconductor chips 141a, 141b, and 141c are arranged on the sintered materials 152a, 152b, and 152c.

Next, as illustrated in FIG. 11, on the semiconductor chips 141a, 141b, and 141c is arranged a single sealing sheet 96 (details are described below) that is large enough to cover all surfaces above the insulating wiring board 13X. The sealing sheet 96 is arranged in contact with upper surfaces of the semiconductor chips 141a, 141b, and 141c.

Then, as illustrated in FIG. 11, an elastic body 97 is arranged on the sealing sheet 96. The elastic body 97 has a predetermined fluidity, which is lower than that of the elastic body 94 in Comparative Example 2, and can retain a predetermined shape.

Next, as illustrated in FIG. 11, an upper die 31C including a space 311 is arranged to face the lower die 2B above the lower die 2B with the insulating wiring board 13X and the like therebetween. The space 311 can contain the elastic body 97 and has substantially the same size as the elastic body 97. The upper die 31C is arranged with the space 311 facing the lower die 2B.

Then, as illustrated in FIG. 12, the sintered materials 152a, 152b, and 152c are pressurized by the upper die 31C and the lower die 2B. The upper die 31C houses the elastic body 97 into the space 311 while descending toward the lower die 2B, and stops in contact with the lower die 2B. As a result, the sealing sheet 96 and the elastic body 97 deform into a shape that mimics a shape of the all surfaces including the insulating wiring board 13X and the like, similarly to Comparative Example 2. This allows the elastic body 97 to pressurize the sintered materials 152a, 152b, and 152c through the sealing sheet 96.

The upper die 31C and the lower die 2B are heated and have a temperature of, for example, approximately 250° C., as with the upper die 3A and the lower die 2 in the present embodiment. This allows the upper die 31C and the lower die 2B to apply heat at 250° C. as well as a pressure of, for example, 20 MPa or more to the sintered materials 152a, 152b, and 152c. As a result, the sintered materials 152a, 152b, and 152c are sintered to bond the semiconductor chips 141a, 141b, and 141c and the insulating wiring board 13X (specifically, the conductive patterns 134a, 134b, and 134c) together.

Thus, the upper die 31C in Comparative Example 3 can pressurize and heat the sintered materials 152a, 152b, and 152c. The upper die 31C in Comparative Example 3 requires to be large enough and strong enough to withstand an internal pressure at which the elastic body 97 tries to spread outward during pressurization and heating onto the sintered materials 152a, 152b, and 152c, similarly to the upper die 31B in Comparative Example 2. This leads to expensive fabrication cost of the upper die 31C, increasing manufacturing cost of a semiconductor module.

On the other hand, the method for manufacturing a semiconductor module according to the present embodiment can use the upper die 3A with the integrally formed protrusions 31a, 31b, and 31c, as described above. Thus, the method for manufacturing a semiconductor module according to the present embodiment can use the upper die 3A simple in structure, and therefore can achieve lower manufacturing equipment cost for and lower manufacturing cost of semiconductor modules than in the method for manufacturing a semiconductor module according to Comparative Example 3.

As described in the method for manufacturing a semiconductor module according to Comparative Example 1, in the case of a mechanism for pressurizing semiconductor chips individually, it is necessary to incorporate a mechanism for generating the same pressurizing force for the semiconductor chips different in height in a die or a jig. Therefore, a die or a jig that needs to incorporate the mechanism needs to be thicker in structure than a die or a jig that does not need to incorporate the mechanism therein.

Further, unevenness of a circuitry formed on a surface of each semiconductor chip affects a pressure distribution on the surface to be pressurized. Therefore, when pressurizing to sinter sintered materials, a buffer material or a protection sheet is required that is thick enough to absorb the unevenness of the surface of the each semiconductor chip. In other words, the individual pressurization portions 92a, 92b, and 92c in Comparative Example 1, the elastic body 94 in Comparative Example 2, and the elastic body 97 in Comparative Example 3 are thick enough to absorb unevenness of the semiconductor chip surfaces.

In methods for manufacturing a semiconductor module using an elastic body, as in Comparative Examples 2 and 3, when an elastic body (e.g., a rubber-like elastic body) having a Poisson's ratio of 0.4 or more is used, the elastic body also spreads laterally during pressurization onto the semiconductor chips, causing pressure dispersion. Therefore, a container-shaped die or jig is required to suppress the lateral spread of the elastic body. The upper die 31A in Comparative Example 1, the upper die 31B in Comparative Example 2, and the upper die 31C in Comparative Example 3 all have a container-like shape capable of enclosing the elastic body.

Vertical pressure applied to the semiconductor chips by the elastic body and pressure spreading laterally due to the vertical pressure are substantially the same in strength. Therefore, as described above, the upper die 31A, the upper die 31B, and the upper die 31C require to be strong enough to withstand the lateral spreading pressure from the elastic bodies. Accordingly, an expensive material is required to form the upper dies 31A, 31B, and 31C, and the upper dies 31A, 31B, and 31c are upsized in order to be thick enough to withstand the strength.

Since a liquid elastic body has higher fluidity than a solid elastic body, it can absorb a stepped difference between a plurality of semiconductor chips to be bonded, but is hard to handle in manufacturing of a semiconductor module. On the other hand, in a solid elastic body, thickness of the elastic body correlates with an amount of absorption of a stepped difference distance between a plurality of semiconductor chips to be bonded. Therefore, since a solid elastic body requires to be thick enough to sufficiently absorb the stepped difference distance to be assumed, a container-like shaped die or jig that can accommodate the thickness of the elastic body is required, leading to upsizing of a device for manufacturing a semiconductor module.

On the other hand, in the method for manufacturing a semiconductor module according to the present embodiment, no container-shaped die is required. Further, the method for manufacturing a semiconductor module according to the present embodiment uses the buffer materials 6a, 6b, and 6c having a Poisson's ratio of 0.2 or less, thereby suppressing the lateral spread. This can keep low a strength required for the positioning jig 4, and enables low-cost fabrication of the positioning jig 4. Further, the method for manufacturing a semiconductor module according to the present embodiment does not have the above-described problems, so that low-cost manufacturing of a semiconductor module can be achieved.

As described above, the method for manufacturing a semiconductor module according to the present embodiment includes arranging the insulating wiring board 13 on the lower die 2, arranging the sintered materials 151*a*, 151*b*, and 151*c* at a plurality of points on the insulating wiring board 13, arranging each semiconductor chip 14*a*, 14*b*, 14*c* on the plurality of sintered materials 151*a*, 151*b*, and 151*c*, arranging each buffer material 6*a*, 6*b*, 6*c* individually on the plurality of semiconductor chips 14*a*, 14*b*, and 14*c*, arranging, above the lower die 2, the upper die 3A including the protrusions 31*a*, 31*b*, and 31*c* at the points corresponding to the arrangement positions of the plurality of semiconductor chips 14*a*, 14*b*, and 14*c* so that the plurality of protrusions 31*a*, 31*b*, and 31*c* correspond to the plurality of semiconductor chips 14*a*, 14*b*, and 14*c*, and sintering by pressurizing and heating the plurality of sintered materials 151*a*, 151*b*, and 151*c* by the protrusions 31*a*, 31*b*, and 31*c* through the plurality of buffer materials 6*a*, 6*b*, and 6*c* and the plurality of semiconductor chips 14*a*, 14*b*, and 14*c*.

According to the method for manufacturing a semiconductor module according to the present embodiment, uniform pressurization and heating can be performed on the plurality of sintered materials 151*a*, 151*b*, and 151*c* for bonding the plurality of semiconductor chips 14*a*, 14*b*, and 14*c* and the insulating wiring board 13 together.

Embodiment 2

Figure 13:
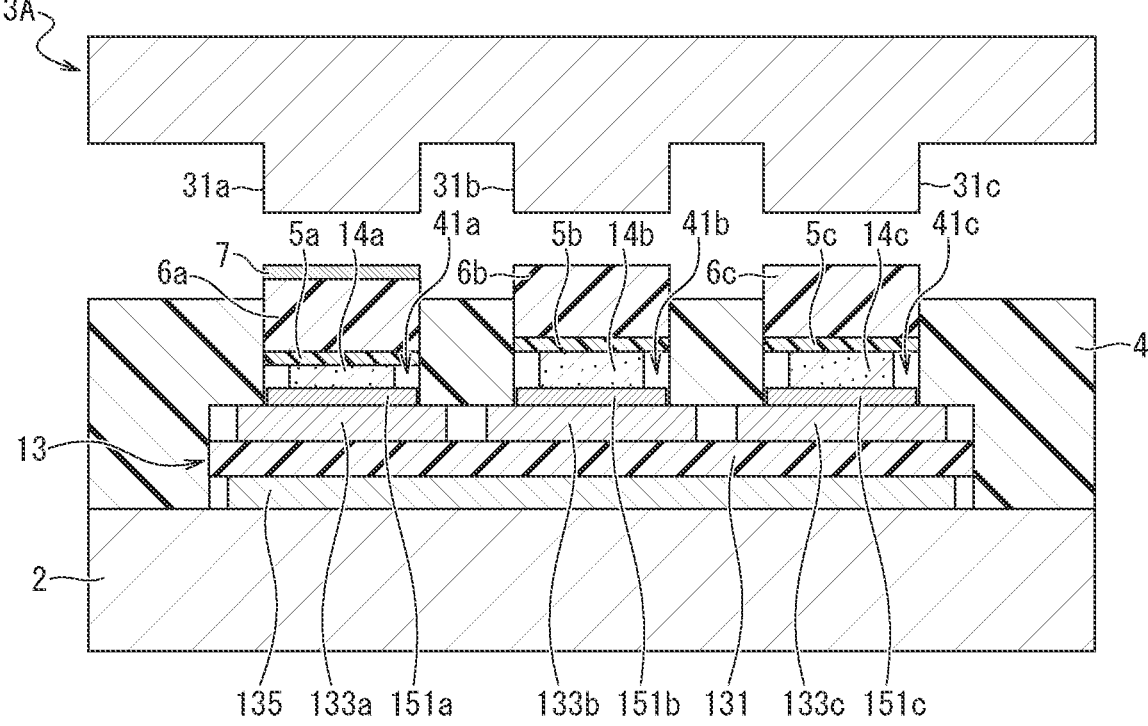
FIG. 13 is a diagram schematically steps of arranging buffer materials, protection sheets, and a spacer member in a method for manufacturing a semiconductor module according to Embodiment 2 of the present invention.
Figure 14:
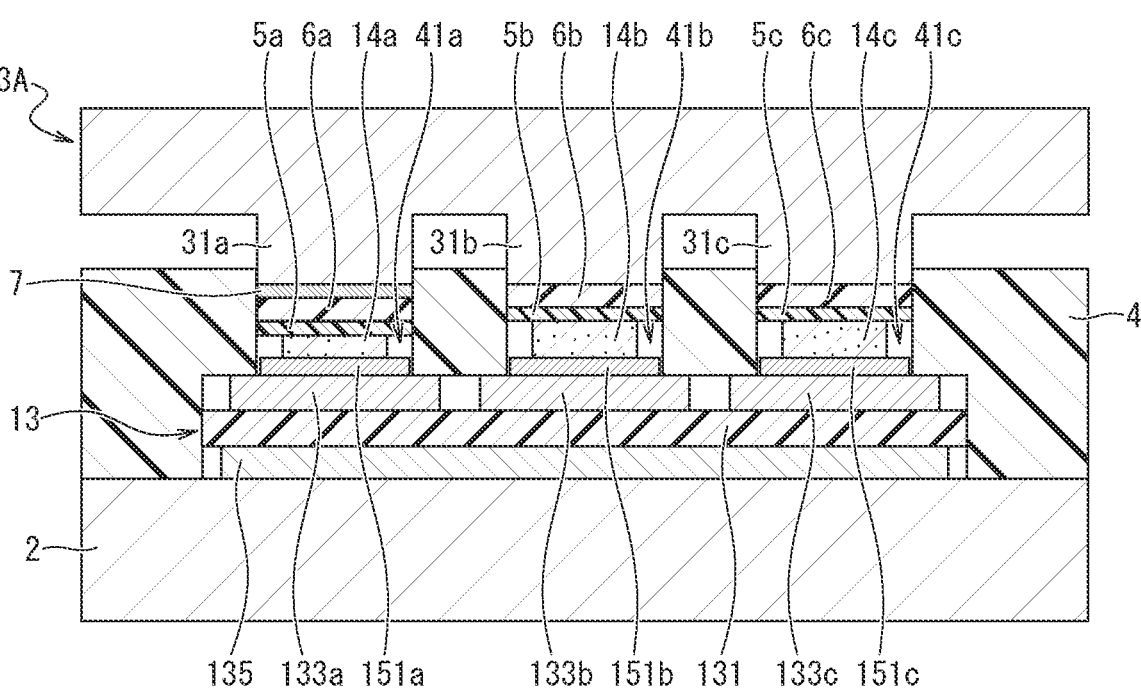
FIG. 14 is a diagram schematically illustrating a sintered material pressurization and heating step in the method for manufacturing a semiconductor module according to Embodiment 2 of the present invention.

A method for manufacturing a semiconductor module according to Embodiment 2 of the present invention is described using FIGS. 13 and 14. The method for manufacturing a semiconductor module according to the present embodiment is characterized by using a spacer member that suppresses a stepped difference between a plurality of semiconductor chips. In the description of the method for manufacturing a semiconductor module according to the present embodiment, members that exert the same effects and functions as those of the members used in the method for manufacturing a semiconductor module according to Embodiment 1 above are denoted by the same reference signs, and descriptions thereof are omitted.

(Configuration of Semiconductor Module)

A semiconductor module manufactured by the method for manufacturing a semiconductor module according to the present embodiment has the same configuration and exerts the same functions as those of a semiconductor module manufactured by the method for manufacturing a semiconductor module according to Embodiment 1 above, and therefore a description thereof is omitted.

(Method for Manufacturing Semiconductor Module)

The method for manufacturing a semiconductor module according to the present embodiment is the same as the method for manufacturing a semiconductor module according to Embodiment 1 above except that a spacer member arrangement step is included between the buffer material arrangement step and the upper die arrangement step (see FIG. 2). Therefore, a description of from the spacer member arrangement step to the sintered material pressurization and heating step (see FIG. 2) is given, and descriptions of the other steps are omitted.

FIG. 13 is a diagram illustrating an example of the spacer member arrangement step and the upper die arrangement step. FIG. 14 is a diagram illustrating an example of the sintered material pressurization and heating step. FIGS. 13 and 14 illustrate a case where the semiconductor chip 14*a* is lower in height than the semiconductor chips 14*b* and 14*c*.

In the spacer member arrangement step, it is determined whether heights of surfaces of the semiconductor chips 14*a*, 14*b*, and 14*c* in contact with the buffer materials 6*a*, 6*b*, and 6*c* are different or not. As illustrated in FIG. 13, when the heights of the surfaces of the semiconductor chips 14*a*, 14*b*, and 14*c* facing the buffer materials 6*a*, 6*b*, and 6*c* side are different, a spacer member 7 configured to reduce the height difference is arranged on the buffer materials 6*a*, 6*b*, and 6*c* (in the present example, the buffer material 6*a*). In the present embodiment, the height of the surface of each semiconductor chip facing each buffer material side is, for example, a distance from the surface of the insulating substrate 132 with each conductive pattern formed thereon. Further, in the present embodiment, the surface of the each semiconductor chip facing the each buffer material side is a surface in contact with each protection sheet. Furthermore, in the present embodiment, the height difference between the surfaces of the semiconductor chips facing the side of the buffer materials is determined by, for example, a controller (not illustrated) of the device for manufacturing a semiconductor module.

When the height difference between the surfaces of the semiconductor chips 14*a*, 14*b*, and 14*c* facing the buffer materials 6*a*, 6*b*, and 6*c* side is 10 μm or more, the spacer member 7 is arranged above any of the plurality of semiconductor chips 14*a*, 14*b*, and 14*c* that is lower in surface height. The example illustrated in FIGS. 13 and 14 assumes that the height of the semiconductor chip 14*a* is, for example, 10 μm or more lower than the height of each of the semiconductor chips 14*b* and 14*c*. Therefore, the spacer member 7 is arranged on the semiconductor chip 14*a* corresponding to the any semiconductor chip lower in the height. The spacer member 7 is, for example, a ceramic or metal member that is, for example, lower in thermal expansion coefficient and higher in compressive strength than the buffer materials 6*a*, 6*b*, and 6*c* and that is heat-resistant to higher temperatures than a temperature applied to the sintered members 151*a*, 151*b*, and 151*c*.

Next, at the upper die arrangement step, as illustrated in FIG. 13, the upper die 3A including the protrusion 31*a*, 31*b*, 31*c* at predetermined points corresponding to the arrangement positions of the plurality of semiconductor chips 14*a*, 14*b*, and 14*c* is arranged above the lower die 2 so that the plurality of protrusions 31*a*, 31*b*, and 31*c* correspond to the plurality of semiconductor chips 14*a*, 14*b*, and 14*c*.

Next, at the sintered material pressurization and heating step, as illustrated in FIG. 14, the plurality of sintered materials 151*a*, 151*b*, and 151*c* are sintered by being pressurized and heated by the protrusions 31*a*, 31*b*, and 31*c* through the plurality of buffer materials 6*a*, 6*b*, and 6*c* and the plurality of semiconductor chips 14*a*, 14*b*, and 14*c*. The spacer member 7 has a thickness of, for example, 10 μm or less. As a result, by arranging the spacer member 7, a difference between the height of the semiconductor chip 14*a* and the height of each of the semiconductor chips 14*b* and 14*c* becomes smaller than 10 μm (the minimum value is 0). Accordingly, even in the upper die 3A including the protrusions 31*a*, 31*b*, and 31*c* different in length, the protrusion 31*a* contacts the spacer member 7 at substantially the same timing as a timing at which the protrusions 31*b* and 31*c* contact the buffer materials 6*b* and 6*c*. As a result, the upper die 3A can apply substantially the same pressurizing force as that onto the other sintered materials 151b and 151c, onto the sintered material 151a that allows the semiconductor chip 14a low in height to bond to the conductive pattern 133a.

Incidentally, a tolerance of thickness dimensions of the buffer materials 6a, 6b, and 6c is, for example, 10 μm. Therefore, when there is a stepped difference of 10 μm or higher between the heights of the semiconductor chips 14a, 14b, and 14c, the buffer materials 6a, 6b, and 6c cannot absorb the stepped difference. This results in varied pressurization onto the sintered materials 151a, 151b, and 151c by the upper die 3A, reducing reliability of the bonding state of the semiconductor chip lower in height among the semiconductor chips 14a, 14b, and 14c.

Thus, the method for manufacturing a semiconductor module according to the present embodiment uses the spacer member 7, when needed, that absorbs the stepped difference between the semiconductor chips 14a, 14b, and 14c. As a result, the method for manufacturing a semiconductor module according to the present embodiment can improve the reliability of the bonding state of the semiconductor chips 14a, 14b, and 14c and the insulating wiring board 13.

As described above, the method for manufacturing a semiconductor module according to the present embodiment includes arranging the insulating wiring board 13 on the lower die 2, arranging the sintered materials 151a, 151b, and 151c at a plurality of points on the insulating wiring board 13, arranging each semiconductor chip 14a, 14b, 14c on the plurality of sintered materials 151a, 151b, and 151c, arranging each buffer material 6a, 6b, 6c individually on the plurality of semiconductor chips 14a, 14b, and 14c, arranging, above the lower die 2, the upper die 3A including the protrusions 31a, 31b, and 31c at points corresponding to arrangement positions of the plurality of semiconductor chips 14a, 14b, and 14c so that the plurality of protrusions 31a, 31b, and 31c correspond to the plurality of semiconductor chips 14a, 14b, and 14c, and sintering by pressurizing and heating the plurality of sintered materials 151a, 151b, and 151c by the protrusions 31a, 31b, and 31c through the plurality of buffer materials 6a, 6b, and 6c and the plurality of semiconductor chips 14a, 14b, and 14c.

As a result, the method for manufacturing a semiconductor module according to the present embodiment can provide the same effects as those of the method for manufacturing a semiconductor module according to Embodiment 1.

Further, in the method for manufacturing a semiconductor module according to the present embodiment, when the heights of the surfaces of the semiconductor chips 14a, 14b, and 14c facing the buffer materials 6a, 6b, and 6c side are different, the spacer member 7 configured to reduce the height difference is arranged on the buffer materials (specifically, the buffer material 6a, 6b, 6c provided above the semiconductor chip 14a, 14b, 14c that is lower in height).

Thus, according to the method for manufacturing a semiconductor module according to the present embodiment, for example, even when the semiconductor chips 14a, 14b, and 14c are different in thickness and a stepped difference that cannot be absorbed by the thickness dimensional tolerance of the buffer materials 6a, 6b, and 6c is present between the semiconductor chips 14a, 14b, and 14c, the sintered materials 151a, 151b, and 151c are sufficiently sintered. This results in ensured reliability of the semiconductor module 1 completed.

Embodiment 3

Figure 15:
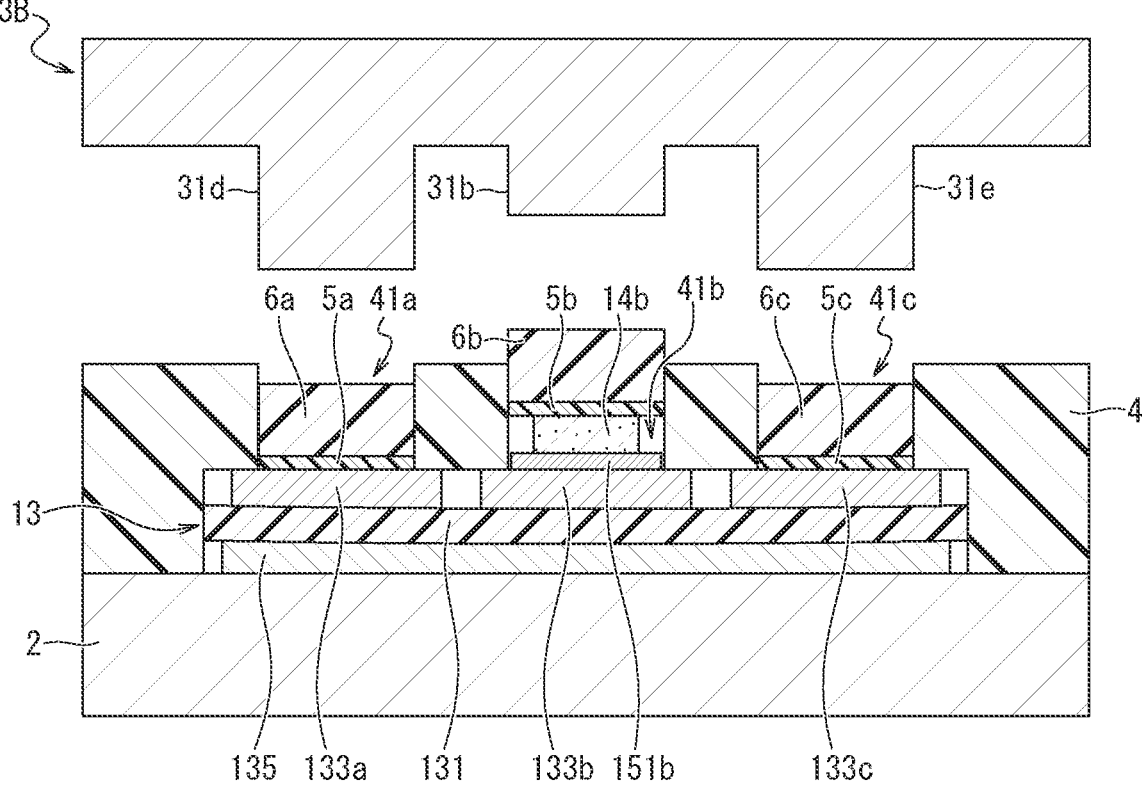
FIG. 15 is a diagram schematically illustrating a buffer material arrangement step in a method for manufacturing a semiconductor module according to Embodiment 3 of the present invention.
Figure 16:
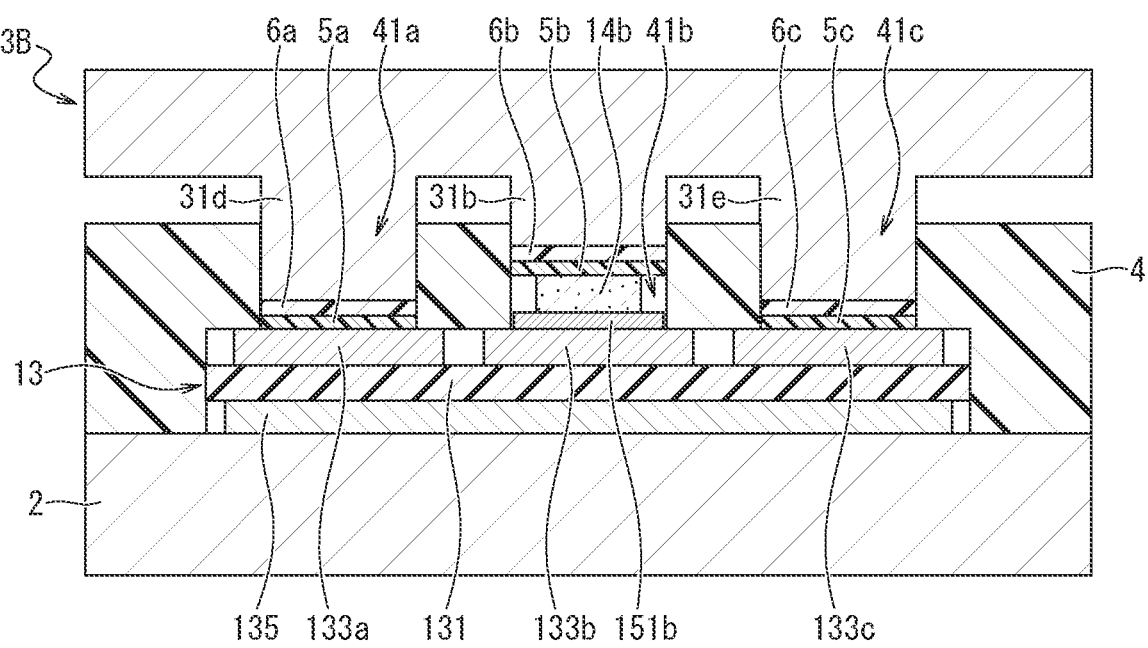
FIG. 16 is a diagram schematically illustrating a sintered material pressurization and heating step in the method for manufacturing a semiconductor module according to Embodiment 3 of the present invention.

A method for manufacturing a semiconductor module according to Embodiment 3 of the present invention is described using FIGS. 15 and 16. The method for manufacturing a semiconductor module according to the present embodiment is characterized in that warping can be corrected that occurs on an insulating wiring board during sintering of sintered materials. In the description of the method for manufacturing a semiconductor module according to the present embodiment, members that exert the same effects and functions as those of the members used in the method for manufacturing a semiconductor module according to Embodiment 1 above are denoted by the same reference signs, and descriptions thereof are omitted.
(Configuration of Semiconductor Module)

A semiconductor module manufactured by the method for manufacturing a semiconductor module according to the present embodiment has the same configuration and exerts the same functions as those of a semiconductor module manufactured by the method for manufacturing a semiconductor module according to Embodiment 1 above, and therefore a description thereof is omitted.
(Method for Manufacturing Semiconductor Module)

The method for manufacturing a semiconductor module according to the present embodiment is the same as the method for manufacturing a semiconductor module according to Embodiment 1 above except that the structure of an upper die is different from that in Embodiment 1 above. Thus, a description of from an upper die arrangement step using the upper die to the sintered material pressurization and heating step (see FIG. 2) is given, and descriptions of other steps are omitted.

FIG. 15 is a diagram illustrating an example of the upper die arrangement step. FIG. 16 is a diagram illustrating an example of the sintered material pressurization and heating step. The insulating wiring board 13 has a structure in which the insulating substrate 132 made of an insulating material is sandwiched by the conductive patterns 133a, 133b, and 133c and the heat transfer member 135 that are made of metal material. Therefore, the insulating substrate 132 is different in thermal expansion coefficient from the conductive patterns 133a, 133b, and 133c and the heat transfer member 136. This can cause stress on the insulating wiring board 13 by heating, cooling, and the like during a fabrication process, which may cause deformation and thickness variation. Accordingly, in the present embodiment, at the sintered pressurization and heating step, i.e., when bonding the semiconductor chips 14a, 14b, and 14c to the insulating wiring board 13, pressurization and heating onto the sintered materials 151a, 151b, and 151c are executed while forcibly flattening the deformed insulating wiring board 13.

As illustrated in FIG. 15, the insulating wiring board 13 while remaining deformed (warped, in this example) is arranged by being secured on the lower die 2 by the positioning jig 4. Further, in the present embodiment, although the semiconductor chip 14b is arranged above the insulating wiring board 13, the semiconductor chips 14a and 14c are not.

In the upper die arrangement step, as illustrated in FIG. 15, an upper die 3B including the protrusion 31b at a point corresponding to an arrangement position of the semiconductor chip 14b and including the protrusion 31d, 31e at points corresponding to arrangement positions of the conductive patterns 133a and 133c is arranged above the lower die 2 so that the protrusions 31b, 31d, and 31e correspond to the semiconductor chip 14b and the conductive patterns 133a and 133c. The protrusions 31d and 31e are formed longer than the protrusion 31b by the amount of a combined thickness of the semiconductor chip 14b and the sintered material 151b. Therefore, when the upper die 3B is arranged to face the lower die 2 with the insulating wiring board 13 and the like therebetween, the protrusions 31*d* and 31*e* protrude more toward the insulating wiring board 13 side than the protrusion 31*b*.

Next, in the sintered material pressurization and heating step, as illustrated in FIG. 16, the conductive patterns 133*a* and 133*c* are pressurized by the protrusions 31*d* and 31*e* through the protection sheets 5*a* and 5*c* and the buffer materials 6*a* and 6*c*. This corrects warping of the insulating wiring board 13, thereby making the insulating wiring board 13 flat. Further, in the sintered material pressurization and heating step, the sintered material 151*b* is pressurized and heated by the protrusion 31*b* through the protection sheet 5*b*, the buffer material 6*b*, and the semiconductor chip 14*b*. As a result, the sintered material 151*b* can be sintered with the shape of the insulating wiring board 13 corrected. Therefore, uniform force and temperature are applied to the sintered material 151*b*, thereby obtaining the sintered material 15*b* (see FIG. 1) having a sintered body in which particles are well bonded together.

Thus, in the method for manufacturing a semiconductor module according to the present embodiment, even when the insulating wiring board 13 deforms, the semiconductor chip 14*b* can be mounted above the insulating wiring board 13 in the well bonding state, so that reliability of the semiconductor module completed can be ensured.

Although FIGS. 15 and 16 illustrate the state where the one semiconductor chip 14*b* is bonded to the insulating wiring board 13, two or more semiconductor chips may be bonded thereto. Further, FIGS. 15 and 16 illustrate the state where the conductive patterns 133*a* and 133*c* are formed at positions corresponding to the protrusions 31*d* and 31*e* for correcting the insulating wiring board 13. However, no conductive patterns may be formed at the positions corresponding to the protrusions 31*d* and 31*e*.

As described above, the method for manufacturing a semiconductor module according to the present embodiment includes arranging the insulating wiring board 13 on the lower die 2, arranging the sintered materials 151*a*, 151*b*, and 151*c* at a plurality of points on the insulating wiring board 13, arranging each semiconductor chip 14*a*, 14*b*, 14*c* on the plurality of sintered materials 151*a*, 151*b*, and 151*c*, arranging each buffer material 6*a*, 6*b*, 6*c* individually on the plurality of semiconductor chips 14*a*, 14*b*, and 14*c*, arranging, above the lower die 2, the upper die 3A including the protrusions 31*a*, 31*b*, and 31*c* at the points corresponding to the arrangement positions of the plurality of semiconductor chips 14*a*, 14*b* and 14*c*, and sintering by pressurizing and heating the plurality of sintered materials 151*a*, 151*b*, and 151*c* by the protrusions 31*a*, 31*b*, and 31*c* through the plurality of buffer materials 6*a*, 6*b*, and 6*c* and the plurality of semiconductor chips 14*a*, 14*b* and 14*c*.

As a result, the method for manufacturing a semiconductor module according to the present embodiment can provide the same effects as those of the method for manufacturing a semiconductor module according to Embodiment 1 above.

Furthermore, the method for manufacturing a semiconductor module according to the present embodiment uses the upper die 3A including the protrusions 31*d* and 31*e* longer in length than the protrusion 31*b* for sintering the sintered material 151*b*, whereby, in the sintered material pressurization and heating step, the deformed insulating wiring board 13 can be forcibly flattened, and the sintered material 151*b* can be sintered.

Thus, the method for manufacturing a semiconductor module according to the present embodiment can simultaneously perform both the correction of deformation of the insulating wiring board 13 and the bonding of the plurality of semiconductor chips 14*a*, 14*b*, and 14*c* to the insulating wiring board 13. This results in ensured reliability of the semiconductor module 1 completed.

The preset invention is not limited to Embodiments 1 to 3, and can be modified in various ways.

In Embodiments 1 to 3, the semiconductor modules 1 are characterized in that the semiconductor chips 14*a*, 14*b*, and 14*c* and the conductive patterns 133*a*, 133*b*, and 133*c* are connected to the terminals 16*a*, 16*b*, and the like provided on the case 11 by bonding wires 17*a*, 17*b*, and the like. However, the present invention is not limited thereto. For example, a semiconductor module manufactured by the method for manufacturing a semiconductor module according to the present invention may have an implant-pin structure using an implant-pin substrate with pins bonded on main surfaces of semiconductor chips to form electrical wiring. Alternatively, for example, a semiconductor module manufactured by the method for manufacturing a semiconductor module according to the present invention may have a lead frame wiring structure.

In Embodiments 1 to 3, the sintered materials 151*a*, 151*b*, and 151*c* are, for example, in a paste form, but may be in a sheet form. In this case, the sintered materials 151*a*, 151*b*, and 151*c* may be transferred onto back surfaces of the semiconductor chips 14*a*, 14*b*, and 14*c* (i.e., surfaces thereof facing the insulating wiring board 13) or may be arranged on the insulating wiring board 13.

Although the methods for manufacturing a semiconductor module according to Embodiments 1 to 3 use the positioning jig 4, the present invention is not limited thereto. The buffer materials 6*a*, 6*b*, and 6*c* have a Poisson's ratio of 0.2 or less, and are hard to spread laterally during pressurization and heating onto the sintered materials 151*a*, 151*b*, and 151*c*, so that lateral pressure distribution is unlikely to occur. Therefore, there is no need to suppress lateral spread of the buffer materials 6*a*, 6*b*, and 6*c* by the positioning jig 4, and thus no positioning jig has to be used.

The technological scope of the present invention is not limited to the exemplary embodiments illustrated and described, but also includes all embodiments that produce effects equivalent to those for which the present invention is intended. Furthermore, the technological scope of the present invention is not limited to combinations of features of the present invention defined by the claims, but may be defined by any desired combination of specific features out of all disclosed respective features.

REFERENCE SIGNS LIST

1: Semiconductor module
2, 2A, 2B, 21A, 21B: Lower die
3, 3A, 3B, 31A, 31B, 31C: Upper die
4: Positioning jig
5*a*, 5*b*, 5*c*: Protection sheet
6*a*, 6*b*, 6*c*: Buffer material
7: Spacer member
11: Case
13, 13X: Insulating wiring board
14*a*, 14*b*, 14*c*, 141*a*, 141*b*, 141*c*: Semiconductor chip
15*a*, 15*b*, 15*c*, 151*a*, 151*b*, 151*c*, 152*a*, 152*b*, 152*c*: Sintered material
16*a*, 16*b*: Terminal
17*a*, 17*b*, 17*c*, 17*d*, 17*e*, 17*f*: Bonding wire
18: Sealing resin
19: Cooler
31*a*, 31*b*, 31*c*, 31*d*, 31*e*: Protrusion

41*a*, 41*b*, 41*c*: Opening portion
51: Protection sheet
91: Pressurization mechanism
92*a*, 92*b*, 92*c*: Individual pressurization portion
94, 97: Elastic body
95, 96: Sealing sheet
111, 311: Space
131, 132: Insulating substrate
131*a*, 131*b*, 131*c*, 133*a*, 133*b*, 133*c*, 134*a*, 134*b*, 134*c*: Conductive pattern
135, 136: Heat transfer member

The invention claimed is:

1. A method of manufacturing a semiconductor module comprising:

arranging an insulating wiring board on a lower die;

arranging, at a plurality of locations on the insulating wiring board, a plurality of sinterable materials respectively corresponding to the plurality of locations;

arranging, on the plurality of sinterable materials, a plurality of semiconductor chips respectively corresponding to the plurality of sinterable materials;

arranging, on the plurality of semiconductor chips, a plurality of buffer materials respectively corresponding to the plurality of semiconductor chips, the plurality of buffer materials having a Poisson's ratio less than or equal to 0.2 such that, when pressurized, the plurality of buffer materials compress along a compression dimension more than the plurality of buffer materials expand along a dimension non-parallel to the compression dimension;

arranging, above the lower die, an upper die including a plurality of protrusions respectively corresponding to the plurality of semiconductor chips such that the plurality of protrusions are at locations corresponding to arrangement locations of the plurality of semiconductor chips; and sintering the plurality of sinterable materials by pressurizing and heating the plurality of sinterable materials through the plurality of buffer materials and the plurality of semiconductor chips with the plurality of protrusions.

2. The method of manufacturing the semiconductor module of claim 1, wherein the plurality of sinterable materials are in a paste or sheet form.

3. The method of manufacturing the semiconductor module of claim 1, wherein the plurality of buffer materials have a heat resistance of 250° C. or higher, a hardness of 80 points±5% on a type A durometer according to JIS K 6253, and a thickness of 1.5 mm or more.

4. The method of manufacturing the semiconductor module of claim 1, wherein heights of surfaces of the plurality of semiconductor chips facing a side of the plurality of buffer materials are different, and the method of manufacturing further includes:

arranging one or more spacer members configured to reduce a difference between the heights on the plurality of buffer materials such that the difference between the heights is reduced.

5. The method of manufacturing the semiconductor module of claim 4, wherein the difference between the heights is 10 μm or more, and the method of manufacturing further includes:

arranging the one or more spacer members a semiconductor chip of the plurality of semiconductor chips that has a lowest height of the heights.

6. The method of manufacturing the semiconductor module of claim 1, further comprising:

before arranging the plurality of semiconductor chips on the plurality of sinterable materials, arranging, on the insulating wiring board, a positioning jig including a plurality of opening portions respectively corresponding to the plurality of semiconductor chips at the locations corresponding to the arrangement locations of the plurality of semiconductor chips.

7. The method of manufacturing the semiconductor module of claim 6, further comprising arranging, on the plurality of semiconductor chips, the plurality of buffer materials such that at least a portion of the plurality of buffer materials is in an opening portion of the positioning jig.

8. The method of manufacturing the semiconductor module of claim 6, wherein the sintering includes inserting each protrusion of the plurality of protrusions into a corresponding opening portion of the plurality of opening portions.

9. The method of manufacturing the semiconductor module of claim 6, wherein the arranging the plurality of buffer materials includes arranging the plurality of buffer materials in respectively corresponding opening portions such that a portion of each buffer material of the plurality of buffer materials protrudes from a respectively corresponding opening portion of the plurality of opening portions.

10. The method of manufacturing the semiconductor module of claim 6, wherein the sintering includes vertically pressurizing the plurality of buffer materials by a first force such that the plurality of buffer materials expand laterally with a second force less than the first force which is thereby applied to a plurality of sidewalls respectively corresponding to the plurality of opening portions.

* * * * *